United States Patent
Maruo et al.

(10) Patent No.: US 11,500,004 B2
(45) Date of Patent: Nov. 15, 2022

(54) TEST APPARATUS AND TEST METHOD

(71) Applicant: ANRITSU CORPORATION, Kanagawa (JP)

(72) Inventors: Tomohiko Maruo, Kanagawa (JP); Hiroyuki Baba, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 79 days.

(21) Appl. No.: 17/322,067

(22) Filed: May 17, 2021

(65) Prior Publication Data
US 2021/0364565 A1    Nov. 25, 2021

(30) Foreign Application Priority Data
May 22, 2020   (JP) .............................. JP2020-089365

(51) Int. Cl.
| | |
|---|---|
| *H01Q 15/14* | (2006.01) |
| *G01R 29/10* | (2006.01) |
| *H04B 17/00* | (2015.01) |
| *H04B 17/15* | (2015.01) |
| *H01Q 15/16* | (2006.01) |
| *G01R 29/08* | (2006.01) |

(52) U.S. Cl.
CPC ....... *G01R 29/105* (2013.01); *G01R 29/0821* (2013.01); *H01Q 15/16* (2013.01)

(58) Field of Classification Search
CPC .... G01R 29/0821; G01R 29/08; G01R 29/10; G01R 29/105; G01R 31/28; G01R 31/319; H01Q 15/14; H01Q 15/16; H01Q 17/00; H01Q 19/10; H04B 17/00; H04B 17/15
See application file for complete search history.

(56) References Cited

U.S. PATENT DOCUMENTS

| | | | | |
|---|---|---|---|---|
| 4,949,093 | A  * | 8/1990 | Dhanjal | H01Q 3/46 |
| | | | | 343/755 |
| 10,042,095 | B2 * | 8/2018 | Crawford | H01Q 19/132 |
| 10,763,979 | B2 * | 9/2020 | Maruo | H01Q 15/14 |
| 10,969,427 | B2 * | 4/2021 | Rowell | G01R 31/3025 |
| 11,290,195 | B2 * | 3/2022 | Wu | H04B 17/29 |
| 11,397,205 | B2 * | 7/2022 | Rowell | G01R 29/105 |

(Continued)

FOREIGN PATENT DOCUMENTS

| | | | |
|---|---|---|---|
| JP | 2003057281 | A  * | 2/2003 |
| JP | 2020-085784 | A | 6/2020 |

OTHER PUBLICATIONS

3GPP TR 38.810 V16.2.0, "3rd Generation Partnership Project; Technical Specification Group Radio Access Network; NR; Study on Test Methods; (Release 16)", Mar. 2019, pp. 1-157.

*Primary Examiner* — Tho G Phan
(74) *Attorney, Agent, or Firm* — Pearne & Gordon LLP

(57) ABSTRACT

A test apparatus includes a test antenna that is provided in an OTA chamber 50 and transmits or receives a radio signal to or from an antenna 110 of a DUT 100, and a measurement device that measures transmission characteristics or reception characteristics of the DUT 100 disposed in a quiet zone QZ, by using the test antenna. The test antenna includes a reflector reflection type test antenna 6a that transmits or receives a radio signal to or from the antenna 110 of the DUT via a reflector 7, and mirror reflection type test antennae 6b, 6c, 6d, 6e, and 6f that transmits or receives a radio signal to or from the antenna 110 of the DUT via mirrors 9b to 9f.

20 Claims, 14 Drawing Sheets

(56) References Cited

U.S. PATENT DOCUMENTS

2019/0036621 A1\* 1/2019 Vanwiggeren ....... H04B 17/354
2019/0302184 A1 10/2019 Rowell et al.
2020/0177289 A1 6/2020 Maruo et al.

\* cited by examiner

TEST APPARATUS AND TEST METHOD

TECHNICAL FIELD

The present invention relates to a test apparatus and a test method for measuring transmission characteristics or reception characteristics of a device under test by using an anechoic box in an OTA (Over The Air) environment.

BACKGROUND ART

In recent years, with the development of multimedia, radio terminals (smartphones and the like) equipped with antennae for radio communication such as cellular and wireless LAN have been actively produced. In the future, in particular, there is a demand for radio terminals that transmit and receive radio signals compatible with IEEE 802.11ad, 5G cellular, and the like, which use wideband signals in the millimeter wave band.

In a design and development company or manufacturing plant of a radio terminal, a performance test as follows is performed on a radio communication antenna of the radio terminal: an output level of a transmission radio wave defined for each communication standard or reception sensitivity is measured, and it is determined whether or not radio frequency (RF) characteristics thereof satisfy predetermined criteria. In the performance test, radio resource management (RRM) characteristics are also measured. The RRM characteristics is measured in order to check whether or not the radio resource control between a base station and a radio terminal, for example, the handover between the adjacent base stations operates correctly.

With the transition of generations from 4G or 4G advanced to 5G, a test method of the above-described performance test also changes. For example, in a performance test in which a radio terminal (referred to as a 5G radio terminal below) for a 5G New Radio (NR) system is set as a device under test (DUT), it is not possible to use a method of connecting an antenna terminal of the DUT and a test apparatus in a wired manner, which is the mainstream in tests for 4G, 4G advanced, or the like. The reason is that characteristics are deteriorated by attaching the antenna terminal to a high frequency circuit, or it is not realistic to attach the antenna terminal to all elements in consideration of a space and cost because the number of elements in an array antenna is large. Therefore, a so-called OTA test is performed (for example, see Patent Documents 1 and 2). In the OTA test, a DUT with a test antenna is accommodated in an anechoic box that is not influenced by the surrounding radio wave environment, transmission of a test signal from the test antenna to the DUT and reception of a measurement target signal from the DUT that receives the test signal by the test antenna are performed by radio communication.

In the OTA test, a quiet zone is formed by the test antenna, and the DUT is disposed in the quiet zone. Here, the quiet zone has a concept representing a range of a spatial region in which the DUT is irradiated with a radio wave emitted from the test antenna with a substantially uniform amplitude and phase in the anechoic box forming the OTA test environment (for example, see Non Patent Document 1). The shape of the quiet zone is usually spherical. It is possible to perform the OTA test in a state where an influence of scattered waves from the surroundings is suppressed, by disposing the DUT in such a quiet zone.

RELATED ART DOCUMENT

Patent Document

[Patent Document 1] Japanese Patent Application No. 2018-223942
[Patent Document 2] US 2019/0302184

Non Patent Document

[Non Patent Document 1] 3GPP TR 38.810 V16.2.0 (2019-03)

DISCLOSURE OF THE INVENTION

Problem that the Invention is to Solve

In the test apparatus disclosed in Patent Document 2, a plurality of test antennae capable of transmitting and receiving to and from an antenna under test of a DUT is provided in an anechoic box, and the RF characteristics and the RRM characteristics of the DUT are measured. In the measurement of the RF characteristics and the RRM characteristics, far field measurement (FFM) is generally used. A reflector having a curved reflecting surface is provided in each test antenna in Patent Document 2. A radio wave radiated from the test antenna is reflected toward the DUT, or a radio wave radiated from the DUT is reflected toward the test antenna. However, in the test apparatus disclosed in Patent Document 2, since the reflector is provided in each of all test antennae, the structure is complicated, and a mechanism of moving the test antenna is also provided. Therefore, a large anechoic box and a large installation area for installing the anechoic box are required.

The present invention has been made to solve such a problem in the related art, and an object of the present invention is to provide a test apparatus and a test method capable of performing far field measurement of transmission and reception characteristics of a device under test, such as RF characteristics and RRM characteristics, with high accuracy and low cost.

Means for Solving the Problem

In order to solve the above problems, according to the present invention, a test apparatus 1 measures transmission characteristics or reception characteristics of a device under test 100 including an antenna under test 110. The test apparatus 1 includes an anechoic box 50 that has an internal space 51 that is not influenced by a surrounding radio wave environment, a test antenna 6 that is provided in the internal space, and transmits or receives a radio signal to or from the antenna under test, a reflector 7 that is provided in the internal space and reflects the radio signal, one or a plurality of mirrors 9b, 9c, 9d, 9e, and 9f that are provided in the internal space and reflect the radio signal, and a measurement device 2 that measures the transmission characteristics or the reception characteristics of the device under test disposed in a quiet zone (QZ) in the internal space, by using the test antenna. The test antenna 6 includes a reflector reflection type test antenna 6a that transmits or receives the radio signal to or from the antenna under test via the reflector, and mirror reflection type test antennae 6b, 6c, 6d, 6e, and 6f that transmit or receive the radio signal to or from the antenna under test via at least one of the one or the plurality of mirrors.

As described above, a plurality of test antennae include the reflector reflection type test antenna that transmits or receives a radio signal to and from the antenna under test via the reflector, and the mirror reflection type test antenna that transmits or receives a radio signal to and from the antenna under test via the mirrors. Since it is possible to change a propagation direction of a radio wave by the mirror, it is possible to lengthen a propagation distance of a radio wave even in a limited small space in the anechoic box. Thus, it is possible to secure a distance (may be referred to as an inter-antenna distance below) between the test antenna and the antenna under test, which is required for far field measurement. Thus, with this configuration, it is possible to reduce the size of the anechoic box and reduce the cost of the test apparatus, in comparison to a case using the reflector antenna in the related art.

In addition, the plurality of test antennae have a hybrid configuration of including the reflector reflection type test antenna that indirectly transmits and receives a radio signal using the reflector and the mirror reflection type test antenna that transmits and receives a radio signal via the mirrors. Thus, it is possible to reduce the number of reflector reflection type test antennae having a complex structure, to the minimum. When the reflector reflection type test antenna that may form the quiet zone relatively wider than the mirror reflection type test antenna is singly used, it is possible to use the wide quiet zone. Therefore, in the test apparatus according to the present invention, it is possible to perform the far field measurement of the transmission and reception characteristics of the device under test, such as the RF characteristics and the RRM characteristics, with high accuracy and low cost.

In the test apparatus according to the present invention, the plurality of the mirrors may be provided. The plurality of mirrors that reflect the radio signal from the mirror reflection type test antenna may be arranged to form different arrival angles with respect to a radio-wave arrival direction from the reflector reflection type test antenna at an arrangement position P0 of the device under test.

With this configuration, in the test apparatus according to the present invention, an arrival angle varies depending on a combination of the reflector reflection type test antenna and the mirror reflection type test antenna. Thus, the arrival angle is changed by switching and using the mirror reflection type test antenna to be used together with the reflector reflection type test antenna, and thereby it is possible to efficiently perform the far field measurement of the transmission and reception characteristics of the device under test, such as the RRM characteristics.

In the test apparatus according to the present invention, the plurality of the mirrors may be provided. The plurality of mirrors may be arranged so that each mirror surface of the plurality of mirrors intersects with a plane passing through the arrangement position P0 of the device under test.

With this configuration, in the test apparatus according to the present invention, it is easy to perform a positioning work when the test apparatus is installed.

In the test apparatus according to the present invention, the one or the plurality of mirrors may include a first mirror 9$b$, a second mirror 9$c$, a third mirror 9$d$, a fourth mirror 9$e$, and a fifth mirror 9$f$. The mirror reflection type test antenna may include a first test antenna 6$b$ that transmits and receives the radio signal via the first mirror, a second test antenna 6$c$ that transmits and receives the radio signal via the second mirror, a third test antenna 6$d$ that transmits and receives the radio signal via the third mirror, a fourth test antenna 6$e$ that transmits and receives the radio signal via the fourth mirror, and a fifth test antenna 6$f$ that transmits and receives the radio signal via the fifth mirror.

With this configuration, in the test apparatus according to the present invention, it is possible to easily individually adjust the distance between the test antenna and the antenna under test. In addition, it is possible to easily form five different arrival angles (for example, 30°, 60°, 90°, 120°, and 150°) with respect to a radio-wave arrival direction from the reflector reflection type test antenna.

In the test apparatus according to the present invention, the plurality of the mirrors may be provided. The test apparatus may further include a direction change unit 60 that changes a radio-wave transmission direction of the mirror reflection type test antenna to be directed to one of the plurality of mirrors.

With this configuration, in the test apparatus according to the present invention, by sharing one mirror reflection type test antenna for the plurality of mirrors, it is not necessary to provide a plurality of mirror reflection type test antennae, and it is possible to further reduce the cost.

In the test apparatus according to the present invention, the one or the plurality of mirrors may include a first mirror 9$b$, a second mirror 9$c$, a third mirror 9$d$, a fourth mirror 9$e$, and a fifth mirror 9$f$. The mirror reflection type test antenna may include a test antenna 6$g$ that transmits and receives the radio signal via one selected from the plurality of mirrors by the direction change unit.

With this configuration, in the test apparatus according to the present invention, it is possible to easily form five different arrival angles (for example, 30°, 60°, 90°, 120°, and 150°) with respect to a radio-wave arrival direction from the reflector reflection type test antenna.

In the test apparatus according to the present invention, a distance from the mirror reflection type test antenna to the antenna under test via the corresponding mirror may be more than $2D^2/\lambda$. Here, D indicates an antenna size of the antenna under test, and $\lambda$ indicates a wavelength of a radio wave transmitted from the mirror reflection type test antenna.

With this configuration, in the test apparatus according to the present invention, since the antenna under test is disposed at a distance of at least $2D^2/\lambda$ from the mirror reflection type test antenna via the mirror, it is possible to reliably perform far field measurement of a device under test even in an anechoic box having a small internal space.

The test apparatus according to the present invention may further include direct type test antennae 6$h$, 6$i$, 6$j$, and 6$k$ that directly transmit or receive the radio signal to or from the antenna under test.

With this configuration, in the test apparatus according to the present invention, it is possible to use the direct type test antenna when the inter-antenna distance required for far field measurement can be secured, and to use the mirror reflection type test antenna only when it is not possible to secure the inter-antenna distance required for the far field measurement. Thus, it is possible to reduce the number of mirrors. In the test apparatus according to the present invention, the reflector may have a reflecting surface bent in a curved surface, and the mirror may have a flat mirror surface.

In the test apparatus according to the present invention, the reflector reflection type test antenna may be disposed at a focal position F of the reflector, and may convert a radio wave of a spherical wave emitted from the reflector reflection type test antenna to a radio wave of a plane wave and transmit the radio wave of the plane wave to the device under test, and cause the radio wave of the plane wave, which is emitted from the device under test and then is incident to the reflector to focus on the test antenna.

In addition, according to the present invention, there is provided a test method using a test apparatus that measures transmission characteristics or reception characteristics of a device under test including an antenna under test. The apparatus includes an anechoic box that has an internal space that is not influenced by a surrounding radio wave environment, a test antenna that is provided in the internal space, and transmits or receives a radio signal to or from the antenna under test, a reflector that is provided in the internal space and reflects the radio signal, one or a plurality of mirrors that are provided in the internal space and reflect the radio signal, and a measurement device that measures the transmission characteristics or the reception characteristics of the device under test disposed in a quiet zone (QZ) in the internal space, by using the test antenna. The test antenna includes a reflector reflection type test antenna that transmits or receives the radio signal to or from the antenna under test via the reflector, and mirror reflection type test antennae that transmit or receive the radio signal to or from the antenna under test via at least one of the one or the plurality of mirrors. The test method includes a step of selecting a test antenna to be used among the test antennae, a step of sequentially changing a posture of the device under test disposed in the quiet zone, and a step of measuring the transmission characteristics or the reception characteristics of the device under test by using the selected test antenna, each time the posture of the device under test is changed.

As described above, in the test apparatus used in the test method according to the present invention, a plurality of test antennae include the reflector reflection type test antenna that transmits or receives a radio signal to and from the antenna under test via the reflector, and the mirror reflection type test antenna that transmits or receives a radio signal to and from the antenna under test via the mirrors. Since it is possible to change a propagation direction of a radio wave by the mirror, it is possible to lengthen a propagation distance of a radio wave even in a limited small space in the anechoic box. Thus, it is possible to secure the distance between the test antenna and the antenna under test, which is required for far field measurement. Therefore, it is possible to use an anechoic box with a small size and low cost.

In addition, in the test apparatus used in the test method, the plurality of test antennae have a hybrid configuration of including the reflector reflection type test antenna that indirectly transmits and receives a radio signal using the reflector and the mirror reflection type test antenna that transmits and receives a radio signal via the mirrors. Thus, it is possible to reduce the number of reflector reflection type test antennae having a complex structure, to the minimum. When the reflector reflection type test antenna that may form the quiet zone relatively wider than the mirror reflection type test antenna is singly used, it is possible to use the wide quiet zone. Therefore, in the test method according to the present invention, it is possible to perform the far field measurement of the transmission and reception characteristics of the device under test, such as the RF characteristics and the RRM characteristics, with high accuracy and low cost.

Advantage of the Invention

According to the present invention, it is possible to provide a test apparatus and a test method capable of performing far field measurement of the transmission and reception characteristics of the device under test, such as the RF characteristics and the RRM characteristics, with high accuracy and low cost.

BEST MODE FOR CARRYING OUT THE INVENTION

Figure 1:
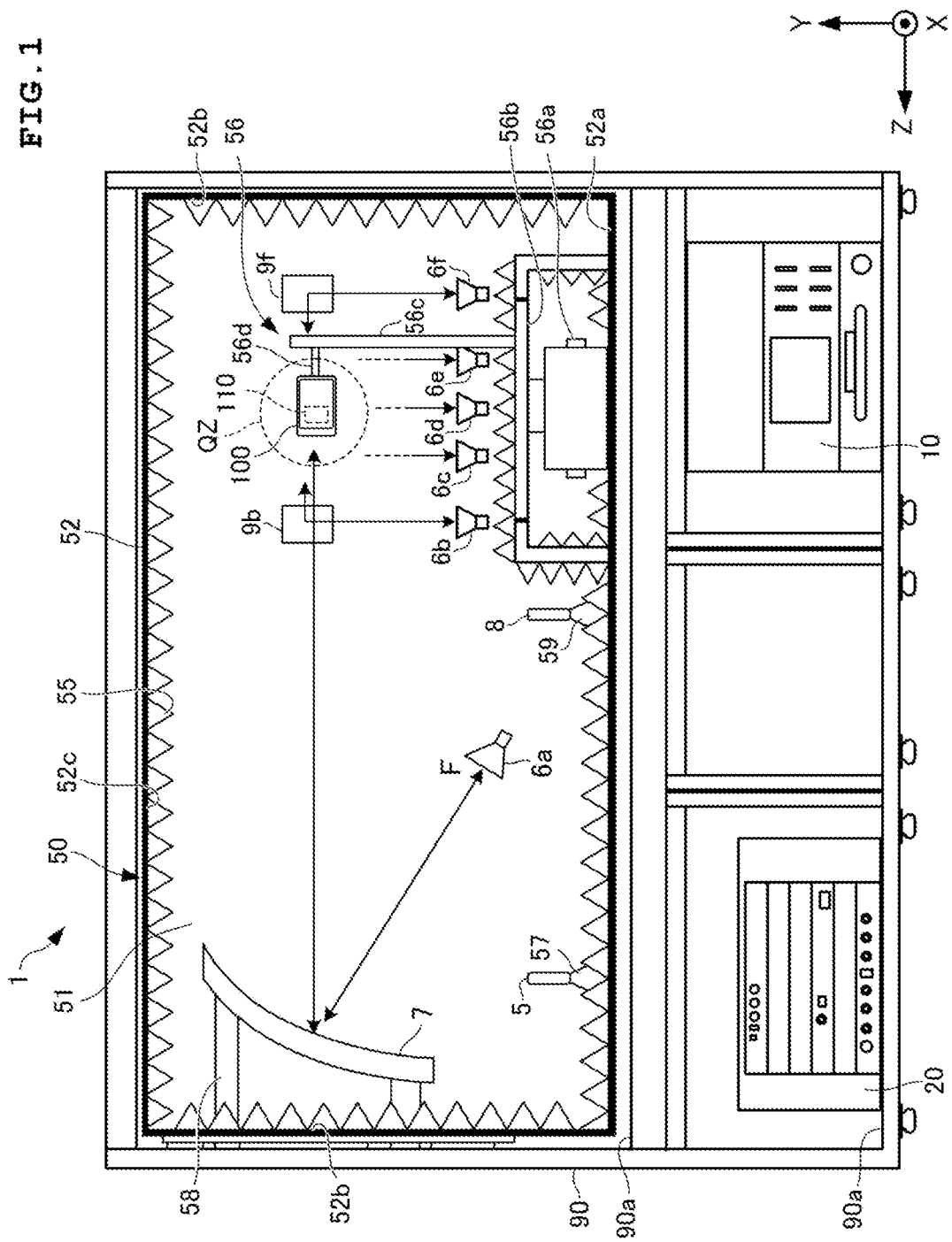
FIG. 1 is a schematic diagram illustrating an overall configuration of a test apparatus according to a first embodiment of the present invention.

Hereinafter, a test apparatus and a test method according to embodiments of the present invention will be described with reference to the drawings. The dimensional ratio of each component in each drawing is not necessarily equal to the actual dimensional ratio.

First Embodiment

A test apparatus 1 according to the present embodiment measures transmission characteristics or reception characteristics of a DUT 100 including an antenna 110, for example, measures RF characteristics and RRM characteristics of the DUT 100. Therefore, the test apparatus 1 includes an OTA chamber 50, a plurality of test antennae 6a, 6b, 6c, 6d, 6e, and 6f (may be referred to as a test antenna 6 below), and a posture changeable mechanism 56, an integrated control device 10, an NR system simulator 20, a signal processing unit 40, and a signal switching unit 41. In the present embodiment, the OTA chamber 50 corresponds to an anechoic box of the present invention. The integrated control device 10, the NR system simulator 20, the signal processing unit 40, and the signal switching unit 41 in the present embodiment correspond to a measurement device 2 of the present invention.

Figure 2:
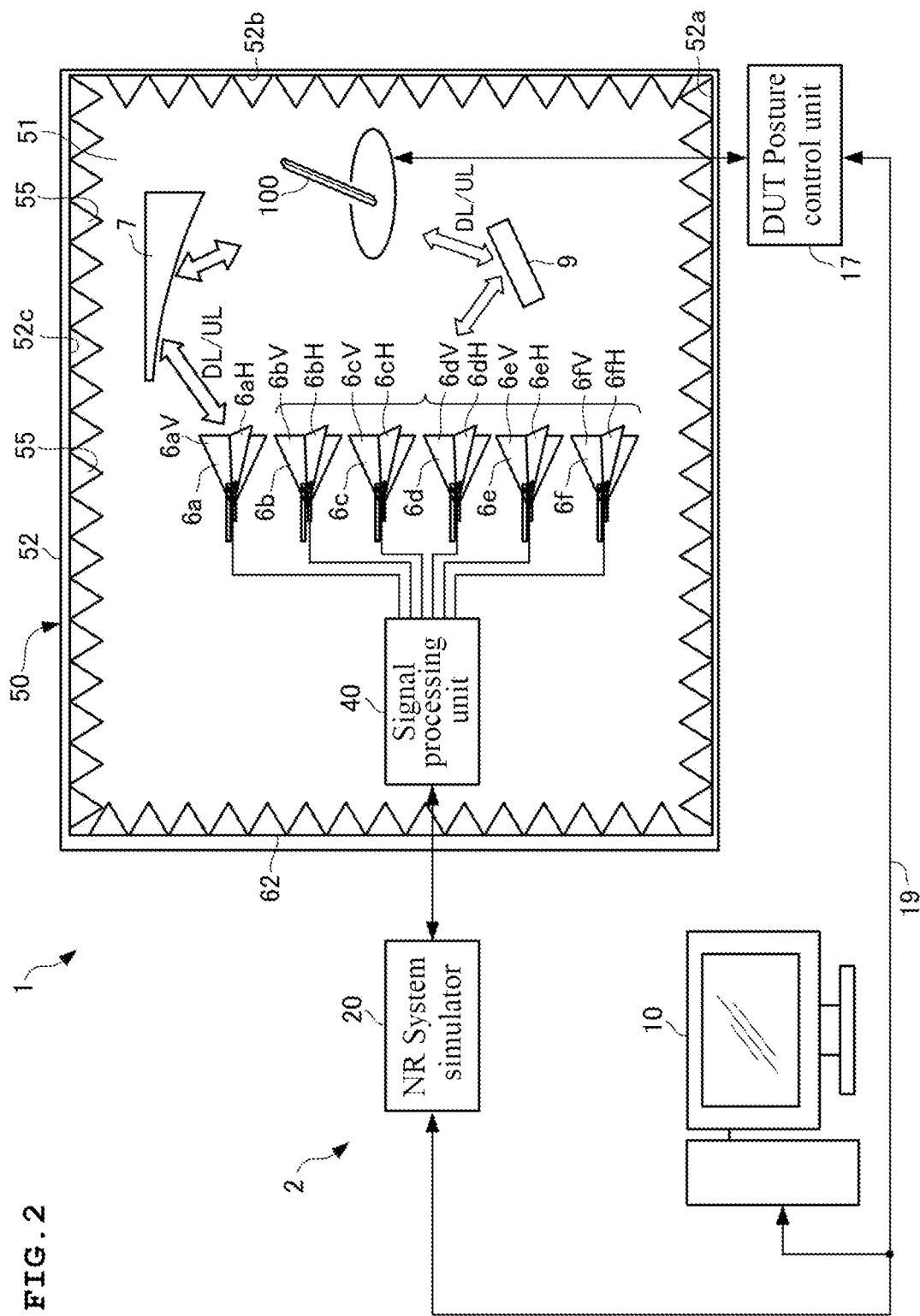
FIG. 2 is a block diagram illustrating a functional configuration of the test apparatus according to the first embodiment of the present invention.

FIG. 1 illustrates an external structure of the test apparatus 1. FIG. 2 illustrates a functional block of the test apparatus 1. FIG. 1 illustrates an arrangement form of components in a state where the OTA chamber 50 is seen through from the front.

As illustrated in FIGS. 1 and 2, the OTA chamber 50 has an internal space 51 that is not influenced by the surrounding radio wave environment. The test antenna 6 is installed in the internal space 51 of the OTA chamber 50, and transmits or receives a radio signal for measuring the transmission characteristics or the reception characteristics of the DUT 100, to and from the antenna 110. The posture changeable mechanism 56 changes the posture of the DUT 100 disposed in a quiet zone QZ in the internal space 51 of the OTA chamber 50. The integrated control device 10, the NR system simulator 20, the signal processing unit 40, and the signal switching unit 41 measure the transmission characteristics or the reception characteristics of the DUT 100 having a posture that is changed by the posture changeable mechanism 56, by using one or two test antennae 6.

The test apparatus 1 is used, for example, together with a rack structure body 90 including a plurality of racks 90a as illustrated in FIG. 1, and is operated in a state where each component is placed on each rack 90a. FIG. 1 illustrates an example in which the integrated control device 10, the NR system simulator 20, and the OTA chamber 50 are mounted on each of three racks 90a of the rack structure body 90. The components will be described below.

OTA Chamber

The OTA chamber 50 realizes an OTA test environment for a performance test of a 5G radio terminal. As illustrated in FIGS. 1 and 2, the OTA chamber is configured by, for example, a metal housing body 52 having a rectangular parallelepiped internal space 51. The OTA chamber 50 accommodates the DUT 100 and the plurality of test antennae 6 facing the antenna 110 of the DUT 100 in the internal space 51 in a state of preventing the intrusion of a radio wave from the outside and the radiation of radio waves to the outside. As will be described later, as the test antenna 6, for example, an antenna for millimeter waves, that has directivity, such as a horn antenna can be used.

A radio wave absorber 55 is attached to the entirety of the inner surface of the OTA chamber 50, that is, the entire surface of the bottom surface 52a, the side surface 52b, and the top surface 52c of the housing body 52 to secure anechoic characteristics of the internal space. Thus, a radiation regulation function of a radio wave to the outside is reinforced. As described above, the OTA chamber 50 realizes the anechoic box having the internal space 51 that is not influenced by the surrounding radio wave environment. The anechoic box used in the present embodiment is, for example, an anechoic type.

DUT

The DUT 100 as a device under test is, for example, a radio terminal such as a smartphone. Communication standards for the DUT 100 includes cellular (LTE, LTE-A, W-CDMA (registered trademark), GSM (registered trademark), CDMA 2000, 1×EV-DO, TD-SCDMA, and the like), wireless LAN (IEEE 802.11b/g/a/n/ac/ad, and the like), Bluetooth (registered trademark), GNSS (GPS, Galileo, GLONASS, BeiDou, and the like), FM, and digital broadcasting (DVB-H, ISDB-T, and the like). The DUT 100 may be a radio terminal that transmits and receives a radio signal of a millimeter wave band corresponding to 5G cellular or the like.

In the present embodiment, the DUT 100 is a 5G NR radio terminal. For the 5G NR radio terminal, it is defined by the 5G NR standard, that a predetermined frequency band including a millimeter wave band and other frequency bands used in LTE and the like is set as a communicable frequency range. Thus, the antenna 110 of the DUT 100 transmits or receives a radio signal of a predetermined frequency band (5G NR band), which is a measurement target for the transmission characteristics or the reception characteristics of the DUT 100. The antenna 110 is, for example, an array antenna such as a Massive-MIMO antenna, and corresponds to an antenna under test in the present invention.

In the present embodiment, the DUT 100 can transmit and receive a test signal and a measurement target signal via one or two test antennae selected from the plurality of test antennae 6 during measurement related to transmission and reception in the OTA chamber 50.

Posture Changeable Mechanism

Next, the posture changeable mechanism 56 provided in the internal space 51 of the OTA chamber 50 will be described. As illustrated in FIG. 1, the posture changeable mechanism 56 is provided on the bottom surface 52a of the housing body 52 of the OTA chamber 50 on the internal space 51 side. The posture changeable mechanism changes the posture of the DUT 100 disposed in the quiet zone QZ. The posture changeable mechanism 56 is, for example, a biaxial positioner including a rotating mechanism that rotates around each of two axes. The posture changeable mechanism 56 forms an OTA test system (Combined-axes system) in which the DUT 100 is rotated with a degree of freedom of rotation around two axes in a state where the test antenna 6 is fixed. Specifically, the posture changeable mechanism 56 includes a drive unit 56a, a turntable 56b, a fulcrum 56c, and a DUT mounting portion 56d as a device-under-test mounting portion.

The drive unit 56a is configured by a drive motor such as a stepping motor that generates a rotational driving force. The drive unit is installed on, for example, the bottom surface 52a. The turntable 56b rotates by a predetermined angle around one of the two axes perpendicular to each other by the rotational driving force of the drive unit 56a. The fulcrum 56c is joined to the turntable 56b. The fulcrum extends from the turntable 56b in a direction of one axis, and rotates together with the turntable 56b by the rotational driving force of the drive unit 56a. The DUT mounting portion 56d extends from the side surface of the fulcrum 56c in a direction of the other axis of the two axes, and rotates by a predetermined angle around the other axis by the rotational driving force of the drive unit 56a. The DUT 100 is mounted on the DUT mounting portion 56d.

The above-described one axis is, for example, an axis (Y axis in FIG. 1) extending in a vertical direction to the bottom surface 52a the drawing). The other axis is, for example, an axis extending in a horizontal direction from the side surface of the fulcrum 56c. The posture changeable mechanism 56 configured as described above can rotate the DUT 100 held on the DUT mounting portion 56*d*, so as to enable the sequential change of the posture of the DUT in a state where the antenna 110 is directed toward the test antenna 6 and the reflector 7 in all three-dimensional directions. For example, the center of the DUT 100 is set as the rotation center (also referred to as an arrangement position).

In the OTA test system, the center of the DUT 100 or the center of the antenna 110 is disposed at the rotation center (also referred to as the origin), which is an intersection between the two rotation axes of the posture changeable mechanism 56. The "arrangement position P0" of the DUT 100 refers to the origin of the OTA test system, and to the center position of the DUT 100 or the center position of the antenna 110, which is disposed in the OTA chamber 50. That is, the arrangement position P0 of the DUT 100 corresponds to the immovable rotation center when the DUT 100 is rotated around two axes by the posture changeable mechanism 56. When the position and the antenna size of the antenna 110 in the DUT 100 are known, and the arrangement position P0 of the DUT 100 is set to the center position of the antenna 110, it is possible to significantly reduce the distance from the test antenna 6 required to form a far field, to the antenna 110.

Link Antenna

In the OTA chamber 50, two types of link antennae 5 and 8 are attached to the required positions of the housing body 52 by using holders 57 and 59, respectively. The link antennae are provided in order to establish or maintain a link (call) with the DUT 100. The link antenna is a link antenna for LTE, and is used in a non-standalone mode. The link antenna 8 is a link antenna for 5G and is used to maintain a 5G call. The link antennae 5 and 8 are held by the holders 57 and 59, respectively, so as to have directivity with respect to the DUT 100 held by the posture changeable mechanism 56. Since it is possible to use the test antenna 6 as the link antenna instead of using the above link antennae 5 and 8, description will be made below on the assumption that the test antenna 6 also has a function of the link antenna.

Near Field and Far Field

Figure 5A:
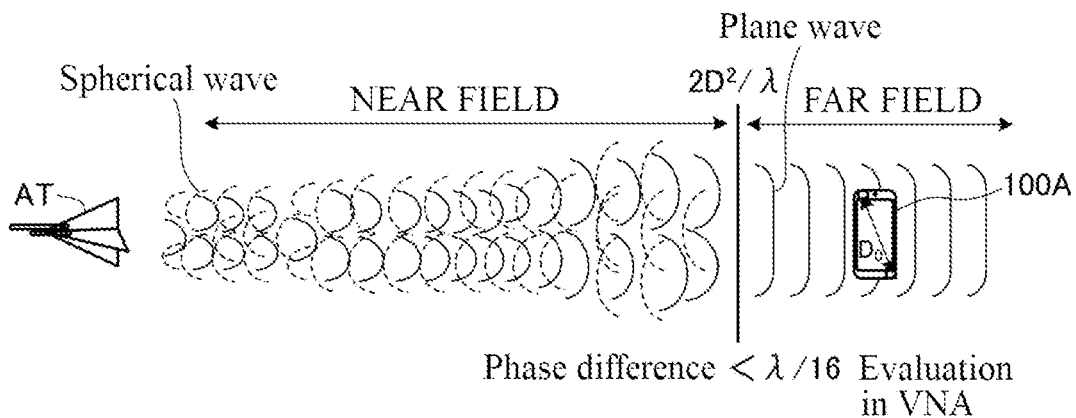
FIGS. 5A and 5B are schematic diagrams illustrating a near field and a far field in radio wave propagation between an antenna AT and a radio terminal.
Figure 5B:
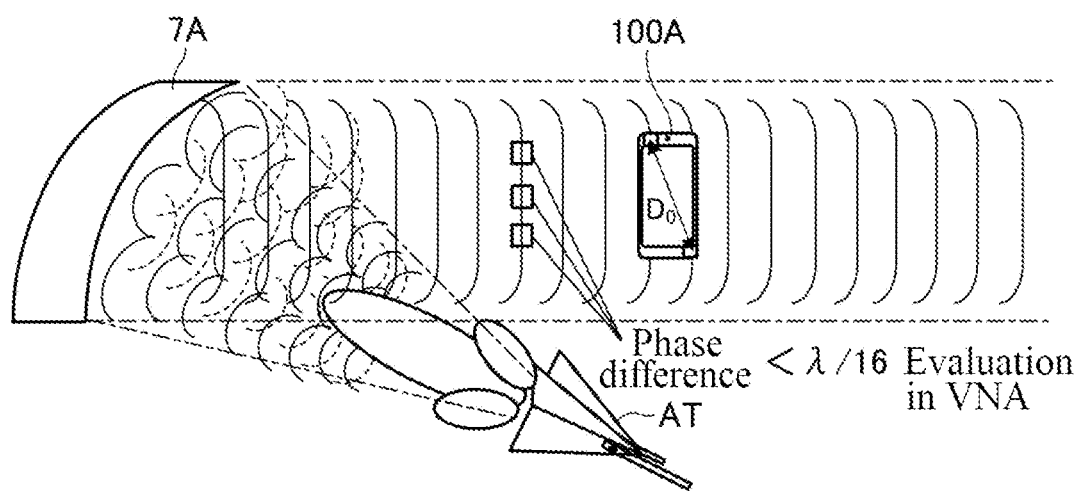

Next, the near field and the far field will be described. FIG. 5 is a schematic diagram illustrating how radio waves radiated from an antenna AT toward a radio terminal 100A are transmitted. The antenna AT is equivalent to the test antenna 6*a* or the mirror reflection type test antennae 6*b*, 6*c*, 6*d*, 6*e*, and 6*f*, as a primary radiator which will be described later. The radio terminal 100A is equivalent to the DUT 100. In FIG. 5, FIG. 5A illustrates a DFF (Direct Far Field) method in which a radio wave is directly transmitted from the antenna AT to the radio terminal 100A, and FIG. 5B illustrates an IFF (Indirect Far Field) method in which a radio wave is transmitted from the antenna AT to the radio terminal 100A through a reflecting mirror 7A having a rotating paraboloid.

As illustrated in FIG. 5A, a radio wave having a radiation source being the antenna AT has a property of propagating while a surface (wave surface) joining points having the same phase spreads spherically around the radiation source. At this time, interference waves generated due to disturbances such as scattering, refraction, and reflection as indicated by broken lines are also generated. The wave surface is a curved spherical surface (spherical wave) at a distance close to the radiation source, but the wave surface becomes close to a plane (plane wave) at a distance far from the radiation source. In general, a region where the wave surface is required to be considered as a spherical surface is referred to as a near field, and a region where the wave surface may not be considered as a plane is referred to as a far field. In the propagation of radio waves illustrated in FIG. 5A, it is preferable that the radio terminal 100A receives a plane wave rather than a spherical wave in order to perform accurate measurement.

In order to receive a plane wave, the radio terminal 100A needs to be installed in a far field. When the position and antenna size of the antenna 110 in the DUT 100 are not known, the far field is a region beyond $2D_0^2/\lambda$ from the antenna AT. Here, Do indicates the maximum linear size of the radio terminal 100A, and λ indicates the wavelength of the radio wave.

Specifically, for example, when the maximum linear size Do of the radio terminal 100A is set to 0.2 m and the frequency of a radio wave is set to 43.5 GHz, the position of 11.6 m from the antenna AT is set as a boundary between the near field and the far field, and it is required to place the radio terminal 100A at a position farther than the boundary.

When the position and the antenna size of the antenna 110 in the DUT 100 are known, the far field is a region beyond $2D^2/\lambda$ from the antenna AT. Here, D indicates the antenna size, and λ indicates the wavelength of the radio wave.

Specifically, for example, when the antenna size D of the radio terminal 100A is set to 0.03 m and the frequency of a radio wave is set to 43.5 GHz, the position of 26.2 cm from the antenna AT is set as a boundary between the near field and the far field, and it is required to place the radio terminal 100A at a position farther than the boundary. Further, for example, when the antenna size D of the radio terminal 100A is set to 0.04 m and the frequency of a radio wave is set to 43.5 GHz, the position of 46.5 cm from the antenna AT is set as a boundary between the near field and the far field.

In the present embodiment, it is assumed that the maximum linear size D of the target DUT 100 is, for example, about 20 cm, and the frequency range to be handled is 24.25 GHz to 43.5 GHz.

FIG. 5B illustrates a method (CATR (Compact Antenna Test Range) method) of disposing the reflecting mirror 7A having a rotating paraboloid so that a radio wave of the antenna AT is reflected, and then the reflected wave reaches the position of the radio terminal 100A. According to such a method, it is possible to reduce the distance between the antenna AT and the radio terminal 100A, and the region of the plane wave expands from the distance immediately after the reflection on the mirror surface of the reflecting mirror 7A. Thus, it is possible to expect an effect of reducing the propagation loss. The degree of the plane wave can be expressed by the phase difference between waves of the same phase. The phase difference that is permissible as the degree of the plane wave is, for example, λ/16. The phase difference can be evaluated, for example, with a vector network analyzer (VNA).

Test Antenna

Figure 7:
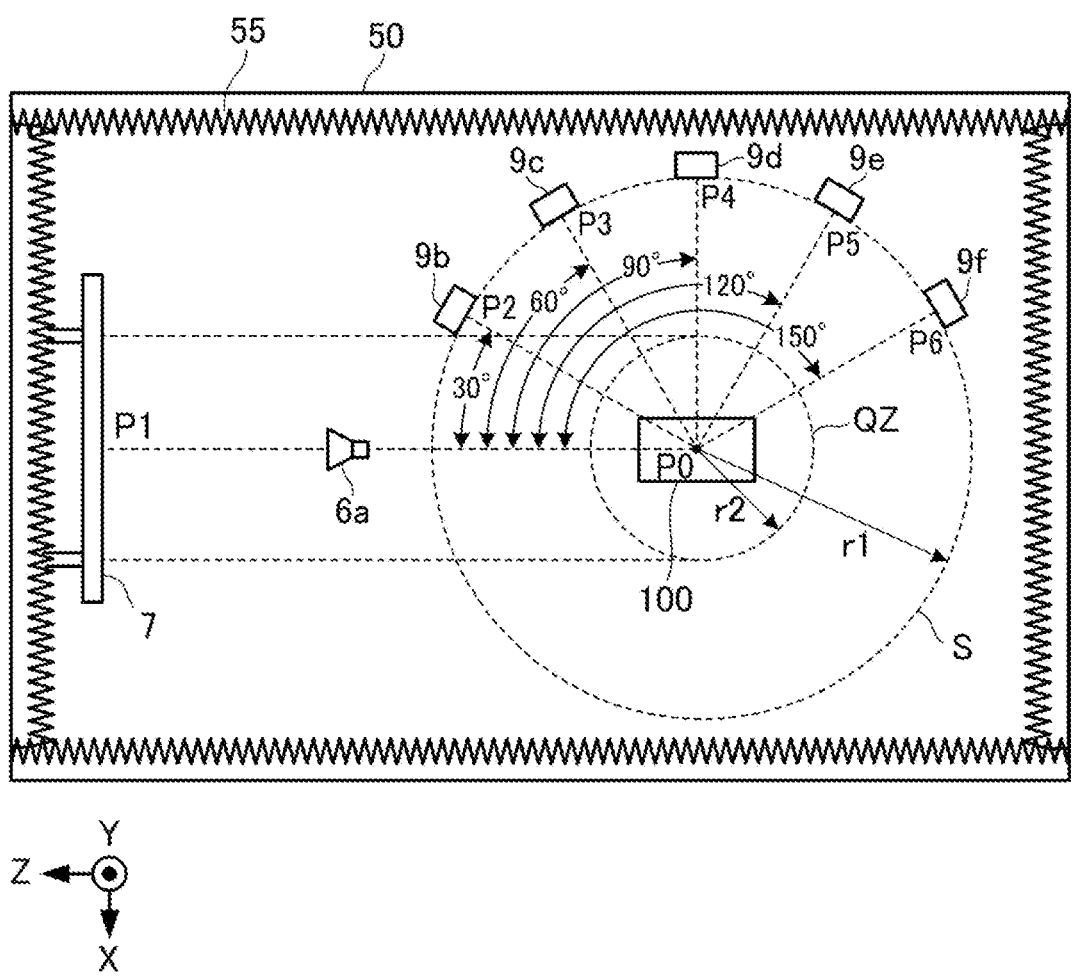
FIG. 7 is a plan view when an OTA chamber in the test apparatus according to the first embodiment of the present invention is viewed from above with removing a top plate of the OTA chamber.
Figure 8:
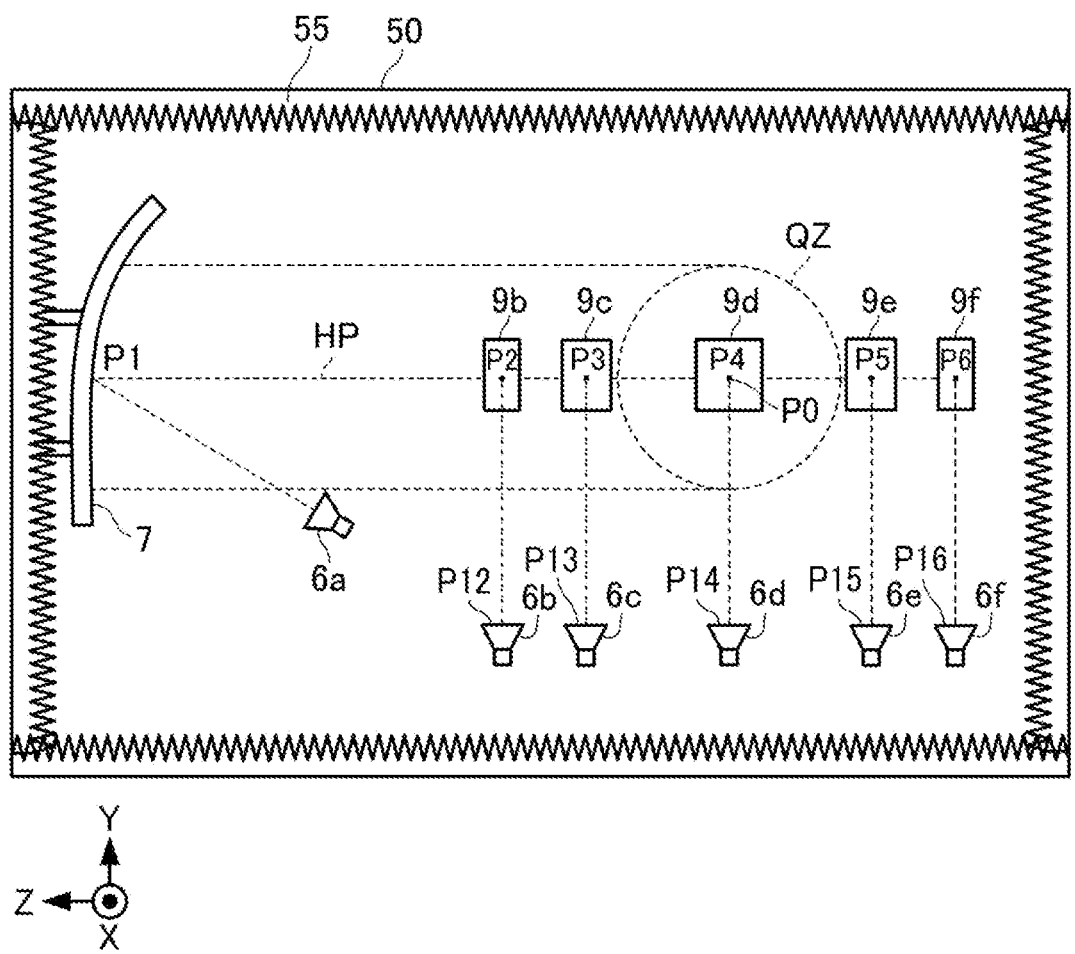
FIG. 8 is a front view when the OTA chamber is viewed from the front side with removing a side plate of the OTA chamber on the front side.

Next, the test antenna 6 will be described. FIG. 7 is a plan view when the OTA chamber 50 of the test apparatus 1 according to the present embodiment is viewed from above with removing a top plate of the OTA chamber. FIG. 8 is a front view when the OTA chamber 50 is viewed from the front side with removing a side plate (side plate on the lower side in FIG. 7) of the OTA chamber on the front side.

As illustrated in FIGS. 7 and 8, the test antenna 6 includes one reflector reflection type test antenna 6*a* and five mirror reflection type test antennae 6*b*, 6*c*, 6*d*, 6*e*, and 6*f*. The reflector reflection type test antenna 6*a* transmits or receives a radio signal (also referred to as a measurement radio signal below) to or from the antenna 110 via the reflector 7. Such a radio signal is provided for measuring the transmission characteristics or the reception characteristics of the DUT 100. The mirror reflection type test antennae 6b, 6c, 6d, 6e, and 6f transmit or receive radio signals for measuring the transmission characteristics or the reception characteristics of the DUT 100, to or from the antenna 110 in the DUT 100 via mirrors 9b, 9c, 9d, 9e, and 9f, respectively. Each of the test antennae 6 includes a horizontally polarized antenna and a vertically polarized antenna (see FIG. 2). The mirrors 9b, 9c, 9d, 9e, and 9f may be simply referred to as a mirror 9 below.

Reflector Reflection Type Test Antenna

Firstly, the reflector reflection type test antenna 6a will be described. The reflector reflection type test antenna 6a functions as the primary radiator and includes a horizontally polarized antenna 6aH and a vertically polarized antenna 6aV (see FIG. 2). The reflector 7 has a reflecting surface bent in a curved surface and reflects radio waves of a measurement radio signal. The reflector has an offset parabolic (see FIG. 6) type structure described later. The reflector 7 is made of, for example, aluminum. As illustrated in FIG. 1, the reflector 7 is attached to the required position of the OTA chamber 50 on the side surface 52b by using a reflector holder 58.

The reflector 7 receives a radio wave of a test signal radiated from the test antenna 6a as the primary radiator disposed at the focal position F defined from the rotating paraboloid, on the rotating paraboloid. Then, the reflector reflects the radio wave toward the DUT 100 held by the posture changeable mechanism 56 (during transmission). The reflector 7 receives the radio wave of a measurement target signal radiated from the antenna 110 by the DUT 100 that has received the test signal, on the rotating paraboloid. Then, the reflector reflects the measurement target signal toward the test antenna 6a (in reception). The reflector 7 is arranged at a position and a posture in which transmission and reception can be simultaneously performed. That is, the reflector 7 is configured to reflect the radio wave of the radio signal transmitted and received between the test antenna 6a and the antenna 110 of the DUT 100 via the rotating paraboloid.

Figure 6:
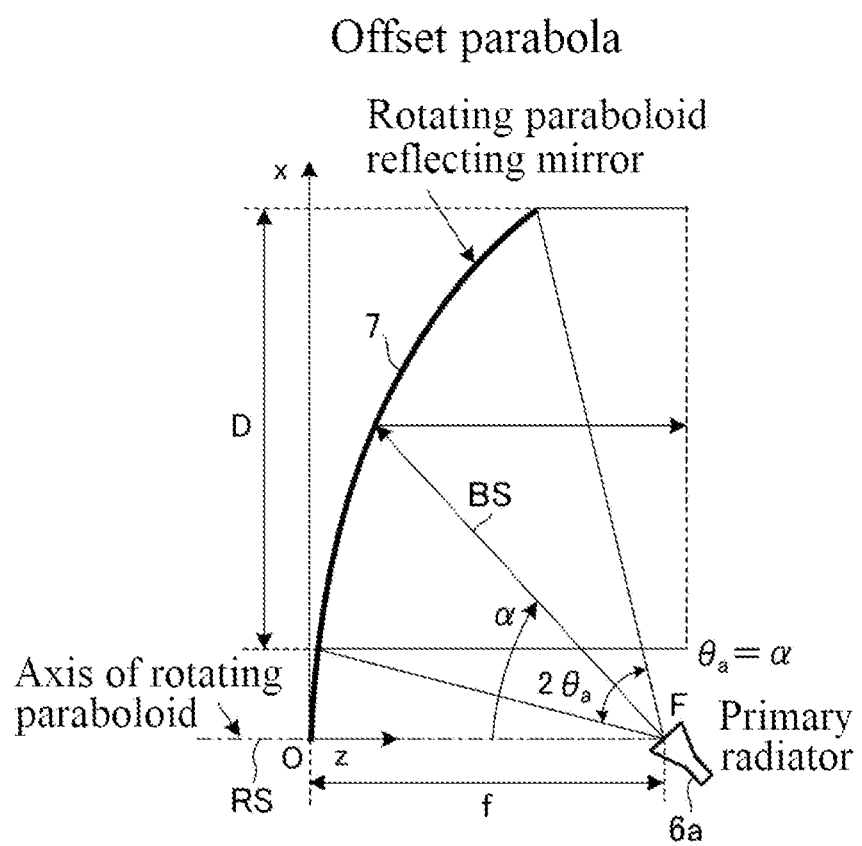
FIG. 6 is a schematic diagram illustrating a structure of a reflector used in the test apparatus according to the first embodiment of the present invention.

FIG. 6 is a schematic diagram illustrating the structure of the reflector 7. The reflector 7 is an offset parabolic type and has a mirror surface (shape obtained by cutting out a portion of the rotating paraboloid of a perfect circular parabola) that is asymmetric with respect to the axis RS of the rotating paraboloid. The test antenna 6a as the primary radiator is located at the focal position F of the offset parabola in an offset state in which a beam axis BS is tilted from an axis RS of the rotating paraboloid, for example, by an angle α (for example, 30°). In other words, the test antenna 6a is disposed to face the reflector 7 at an elevation angle α, and the reception surface of the test antenna 6a is held at an angle perpendicular to the beam axis BS of the radio signal.

With such a configuration, a radio wave (for example, test signal for the DUT 100) radiated from the test antenna 6 is reflected by the rotating paraboloid in a direction parallel to an axial direction of the rotating paraboloid, and a radio wave (for example, measurement target signal transmitted from the DUT 100) incident to the rotating paraboloid in the direction parallel to the axial direction of the rotating paraboloid is reflected by the rotating paraboloid, and thus the radio waves can be guided to the test antenna 6a. In other words, the reflector 7 converts a radio wave of a spherical wave radiated from the test antenna 6a to a radio wave of a plane wave and transmits the radio wave of the plane wave to the DUT 100, and also causes a radio wave of a plane wave that is radiated from the DUT 100 and then is incident on the reflector 7 to focus on the test antenna 6a. Compared to the parabolic type, the offset parabola requires the reflector 7 to be smaller and can be disposed so that the mirror surface becomes close to being a vertical surface. Thus, it is possible to reduce the size of the structure of the OTA chamber 50.

As understood from FIG. 8, the reflector reflection type test antenna 6a is disposed below a horizontal plane HP passing through the arrangement position P0 of the DUT 100. A radio beam that is radiated from the test antenna 6a and then reflected by the reflector 7 is propagated in a negative direction of a Z axis and forms a quiet zone QZ having a radius r2. The center of the radio beam reflected at a position P1 being an aperture center of the reflector 7 is propagated in the negative direction of the Z axis and then reaches the arrangement position P0 of the DUT 100.

Mirror Reflection Type Test Antenna

Next, the mirror reflection type test antenna 6 will be described.

The mirror reflection type test antenna 6 transmits or receives a radio signal to and from the antenna 110 of the DUT 100 via the mirror 9 that reflects the radio wave of the measurement radio signal. Specifically, the mirror reflection type test antenna 6 includes a first test antenna 6b, a second test antenna 6c, a third test antenna 6d, a fourth test antenna 6e, and a fifth test antenna 6f. The mirror 9 includes a first mirror 9b, a second mirror 9c, a third mirror 9d, a fourth mirror 9e, and a fifth mirror 9f. Each mirror 9 is made of, for example, aluminum and has a flat mirror surface.

Specifically, the first test antenna 6b transmits and receives a radio signal to and from the antenna 110 of the DUT 100 via the first mirror 9b. The second test antenna 6c transmits and receives a radio signal via the second mirror 9c. The third test antenna 6d transmits and receives a radio signal via the third mirror 9d. The fourth test antenna 6e transmits and receives a radio signal via the fourth mirror 9e. The fifth test antenna 6f transmits and receives a radio signal via the fifth mirror 9f.

The mirror reflection type test antennae 6b, 6c, 6d, 6e, and 6f include horizontally polarized antennae 6bH, 6cH, 6dH, 6eH, and 6fH, and vertically polarized antennae 6bV, 6cV, and 6dV, 6eV, and 6fV, respectively (see FIG. 2).

The mirror 9 is arranged so that the reflecting surface of each mirror intersects with the horizontal plane HP passing through the arrangement position P0 of the DUT 100. Specifically, the mirrors 9b, 9c, 9d, 9e, and 9f are arranged on a virtual spherical surface S and the horizontal plane HP. The virtual spherical surface has a radius r1 with the arrangement position P0 of the DUT 100 as the center. "The mirrors are arranged on the virtual spherical surface S and the horizontal plane HP" means that reflection points P2, P3, P4, P5, and P6, at which the center of the radio beam is reflected on the reflecting surfaces of the mirrors 9b, 9c, 9d, 9e, 9f, respectively, are located on the virtual spherical surface S and on the horizontal plane HP.

The arrangement of the mirrors 9b, 9c, 9d, 9e, and 9f is not limited to being on the horizontal plane HP. The mirrors may be arranged on any plane passing through the arrangement position P0 of the DUT 100 and may not be necessarily arranged on the same plane. It is not necessary that the mirrors 9b, 9c, 9d, 9e, and 9f are arranged at the same distance from the DUT 100. The mirrors 9b, 9c, 9d, 9e, and 9f may have different distances from the DUT 100.

The mirror reflection type test antennae 6b, 6c, 6d, 6e, and 6f are arranged below the horizontal plane HP passing through the arrangement position P0 of the DUT 100. The radio beam radiated from the mirror reflection type test antenna 6 is mirror-reflected by the corresponding mirror 9. The incident angle and the reflection angle of the radio beam in each mirror 9 may be different or the same for each mirror as long as the radio beam reflected by each mirror 9 reaches the DUT 100. In the present embodiment, the mirror reflection type test antennae 6b, 6c, 6d, 6e, and 6f are supported by a support on the bottom surface 52a of the OTA chamber 50, but may be arranged above the horizontal plane HP or on the horizontal plane HP.

In the present embodiment, one mirror 9 is disposed in a radio wave propagation path between the mirror reflection type test antenna 6 and the DUT 100, but two or more mirrors may be arranged. That is, the mirror surface reflection may be caused a plurality of number of times by the plurality of mirrors during the propagation of the radio wave to secure an inter-antenna distance required for the far field measurement.

In the present embodiment, the mirrors 9b, 9c, 9d, 9e, and 9f that reflect a radio signal from the mirror reflection type test antenna 6 are arranged to form different arrival angles at the arrangement position P0 of the DUT 100 with respect to a radio-wave arrival direction from the reflector reflection type test antenna 6a and the reflector 7. Thus, since the arrival angle varies depending on the combination of the reflector reflection type test antenna 6a and one of the mirror reflection type test antennae 6b, 6c, 6d, 6e, and 6f, the arrival angle is changed by switching and using the test antenna between the mirror reflection type test antennae 6b, 6c, 6d, 6e, and 6f. Thus, it is possible to efficiently perform the far field measurement of the transmission and reception characteristics of the DUT 100, such as the RRM characteristics.

As illustrated in FIG. 7, for example, a radio beam transmitted from the mirror reflection type test antenna 6b via the mirror 9b forms an arrival angle of 30° at the arrangement position P0 of the DUT 100 by using a radio-wave arrival direction (Z axis) from the reflector reflection type test antenna 6a, as the reference. Similarly, radio beams transmitted from the mirror reflection type test antennae 6c, 6d, 6e, and 6f via the mirrors 9c, 9d, 9e, and 9f form arrival angles of 60°, 90°, 120°, and 150°, respectively. That is, the first to fifth test antennae 6b, 6c, 6d, 6e, and 6f can realize relative arrival angles of 30°, 60°, 90°, 120°, and 150° together with the reflector reflection type test antenna 6a. In this manner, it is possible to evenly perform the measurement within a predetermined angle range without omission, and thus it is possible to perform the far field measurement of the transmission and reception characteristics of the DUT 100, such as the RRM characteristics, with high accuracy. This makes it possible to measure the RRM characteristics defined in the standard 3GPP TR 38.810 V16.2.0 (2019-03) with high accuracy.

Here, the "arrival angle (AoA)" refers to an angle formed by a radio beam or the center of the radio beam arriving at the arrangement position P0 from the test antenna 6 with respect to a specific straight line (for example, Z axis) passing through the arrangement position P0 of the DUT 100. The arrival angle can also be defined by two test antennae. In this case, an angle formed by a radio beam or the center of the radio beam arriving at the arrangement position P0 from one test antenna with a radio-wave arrival direction (being a direction of the radio beam arriving at the arrangement position P0 from another test antenna) as the reference is referred to as the "arrival angle" or a "relative arrival angle".

When the antenna size D of the antenna 110 is known, the distances from the mirror reflection type test antennae 6b, 6c, 6d, 6e, and 6f to the antenna 110 of the DUT 100 via the corresponding mirrors 9b, 9c, 9d, 9e, and 9f may be set to be more than $2D^2/\lambda$. D indicates the antenna size of the antenna 110. $\lambda$ indicates the wavelength of a radio wave transmitted from the mirror reflection type test antenna 6. As a result, it is possible to perform the far field measurement of the DUT 100.

Figure 9:
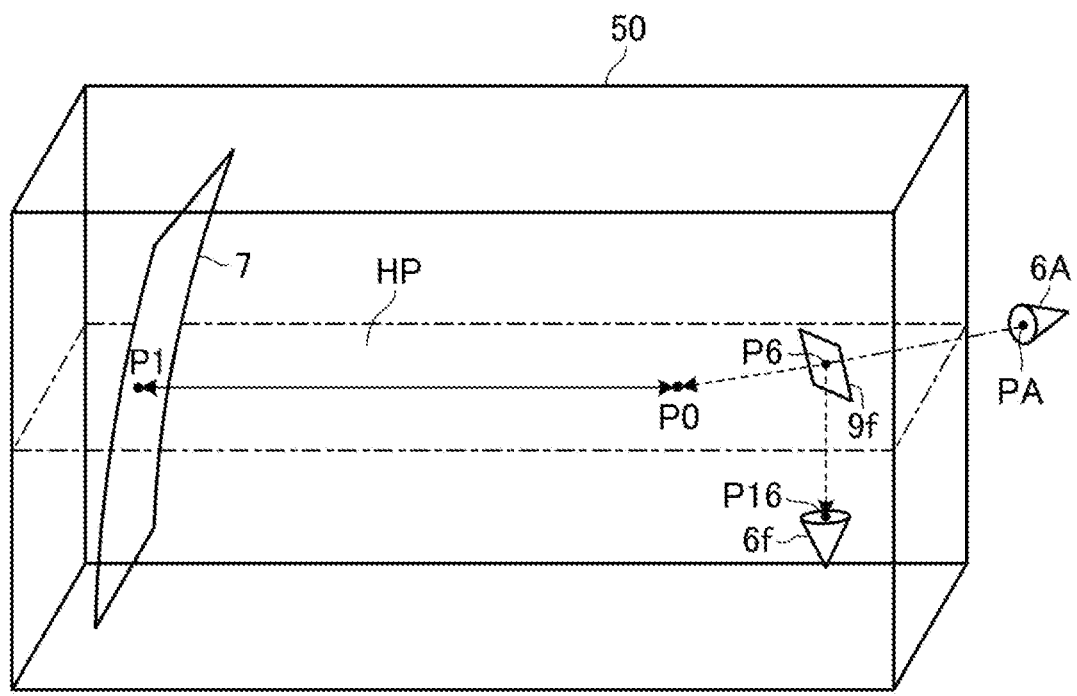
FIG. 9 is a schematic diagram illustrating arrangement of a mirror and a mirror reflection type test antenna in the OTA chamber.

FIG. 9 is a schematic diagram illustrating the arrangement of the mirror 9f and the mirror reflection type test antenna 6f in the OTA chamber 50. In FIG. 9, the other mirrors and the other the test antennae are not illustrated. The test antenna 6f is disposed below the horizontal plane HP. The mirror 9f is disposed so that a reflection point P6 of a radio beam on the mirror surface is located on the horizontal plane HP. A radio beam radiated from the test antenna 6f is reflected by the mirror 9f and transmitted to the arrangement position P0 of the DUT 100. A radio beam radiated from the antenna 110 of the DUT 100 is reflected by the mirror 9f and transmitted to the test antenna 6f. If the mirror 9f is not provided, the test antenna 6A is disposed outside the OTA chamber 50, and thus it is not possible to secure the inter-antenna distance (P0-PA distance) required for the far field measurement. Since the propagation path of the radio beam is bent by the mirror 9f, it is possible to dispose the test antenna 6f in the OTA chamber 50, and secure the inter-antenna distance required for the far field measurement.

Specifically, in FIG. 9, a distance obtained by combining a P0-P6 distance and a P6-P16 distance is equal to the P0-PA distance being the inter-antenna distance required for the far field measurement. P6 indicates a reflection point at which a radio beam radiated from the test antenna 6f is reflected on the mirror 9f. P16 indicates an aperture center of the test antenna 6f. PA indicates an aperture center of a virtual test antenna 6A. The propagation path between P0 and P6 is on the horizontal plane HP. The radio beam radiated from the reflector reflection type test antenna 6a is reflected at the reflection point P1 on the reflector 7 and transmitted to the arrangement position P0 of the DUT 100. The propagation path between P1 and P0 is also on the horizontal plane HP.

The reflector reflection type test antenna 6a forms a so-called indirect far field (IFF). The mirror reflection type test antennae 6b, 6c, 6d, 6e, and 6f form a direct far field (DFF). The indirect far field refers to a far field formed by a reflective antenna using a reflector that converts a spherical wave to a plane wave. The direct far field is a far field formed by an antenna that does not use such a reflector. The mirror reflection type test antenna 6 reflects a radio beam using the mirror, but a distance traveled by the radio beam from the test antenna to the far field is equal to that when the mirror is not provided. Thus, the mirror reflection type test antenna 6 can be considered as a DEF type antenna.

The mirror reflection type test antennae 6b, 6c, 6d, 6e, and 6f and the mirrors 9b, 9c, 9d, 9e, and 9f are arranged outside the path of a radio beam that is reflected by the reflector 7 of the reflector reflection type test antenna 6a and passes through the quiet zone QZ. With this configuration, in the test apparatus 1 according to the present embodiment, it is possible to form a favorable quiet zone QZ.

In the present embodiment, the five mirror reflection type antennae 6 and the five mirrors 9 are provided, but the number of antennae is not limited to this. Each number may be set to any number depending on the test content.

In the present embodiment, the quiet zone formed by the mirror reflection type test antennae 6b, 6c, 6d, 6e, and 6f is the same as the quiet zone QZ formed by the reflector reflection type test antenna 6a, but is not limited to this. The quiet zone formed by the mirror reflection type test antennae 6b, 6c, 6d, 6e, and 6f may be different from the quiet zone QZ formed by the reflector reflection type test antenna 6a. For example, if the quiet zone QZ formed by the reflector reflection type test antenna 6a is made wider, it is possible to use a wide quiet zone when the RF characteristics and the like are measured singly using the reflector reflection type test antenna 6a.

Next, the integrated control device 10 and the NR system simulator 20 of the test apparatus 1 according to the present embodiment will be described with reference to FIGS. 2 to 4.

Integrated Control Device

As described below, the integrated control device 10 collectively controls the NR system simulator 20 and the posture changeable mechanism 56. Therefore, the integrated control device 10 is communicably connected to the NR system simulator 20 and the posture changeable mechanism 56 via a network 19 such as Ethernet (registered trademark), for example.

Figure 3:
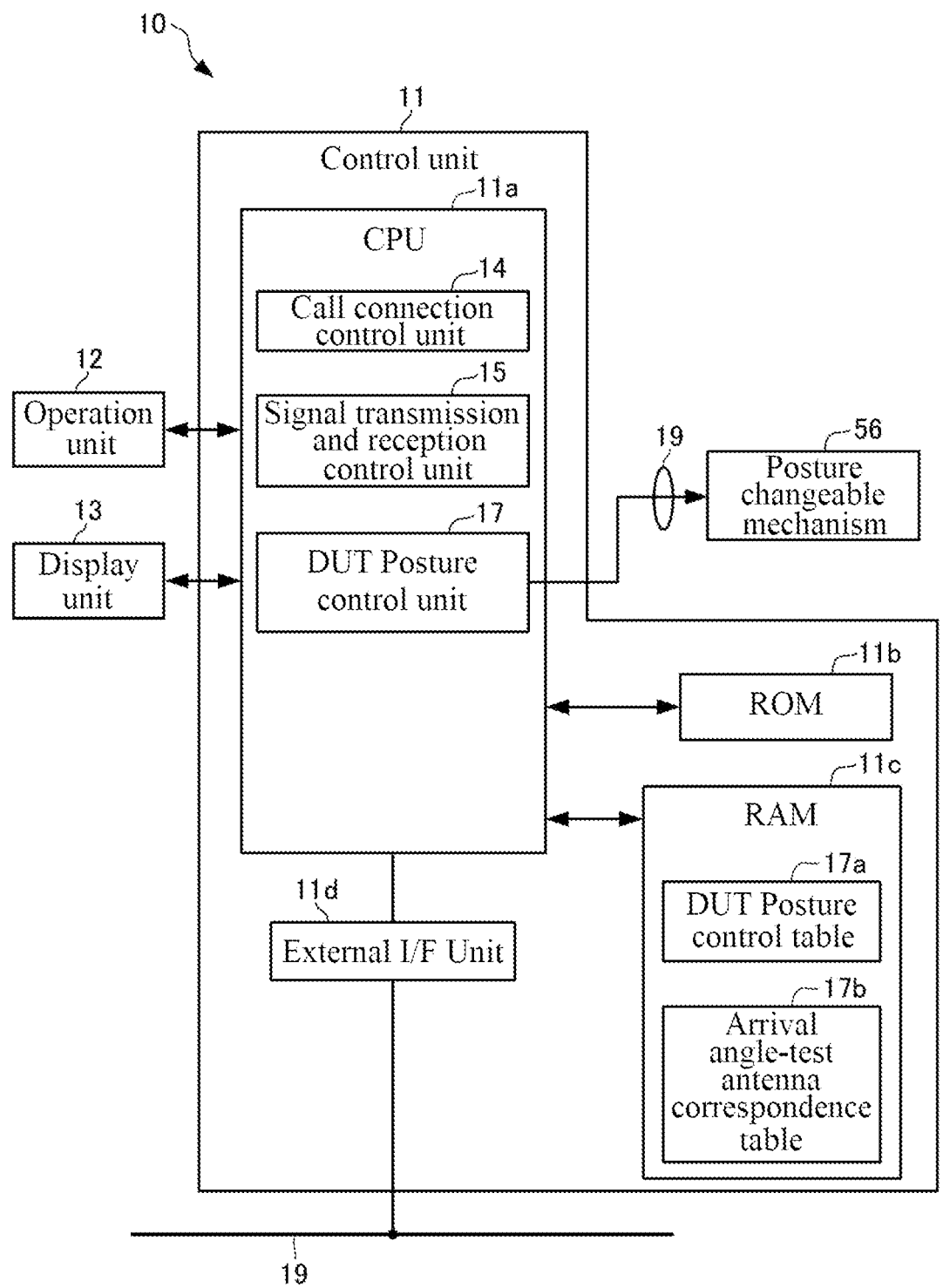
FIG. 3 is a block diagram illustrating a functional configuration of an integrated control device in the test apparatus according to the first embodiment of the present invention.

FIG. 3 is a block diagram illustrating a functional configuration of the integrated control device 10. As illustrated in FIG. 3, the integrated control device 10 includes a control unit 11, the operation unit 12, and a display unit 13. The control unit 11 is configured by, for example, a computer device. The computer device includes, for example, a central processing unit (CPU) 11a, a read only memory (ROM) 11b, a random access memory (RAM) 11c, an external interface (I/F) unit 11d, a non-volatile storage medium such as a hard disk device (not illustrated), and various input/output ports, as illustrated in FIG. 3.

The CPU 11a is configured to collectively control the NR system simulator 20 as a target. The ROM 11b stores an operating system (OS) for starting up the CPU 11a, other programs, control parameters, and the like. The RAM 11c stores execution codes, data, and the like of the OS and applications used in an operation of the CPU 11a. The external interface (I/F) unit 11d has an input interface function of receiving an input of a predetermined signal and an output interface function of outputting a predetermined signal.

The external I/F unit 11d is communicably connected to the NR system simulator 20 via the network 19. The external I/F unit 11d is also connected to the posture changeable mechanism 56 in the OTA chamber 50 via the network 19. The operation unit 12 and the display unit 13 are connected to the input/output port. The operation unit 12 is a functional unit for inputting various types of information such as commands. The display unit 13 is a functional unit of displaying various types of information such as an input screen for the various types of information and measurement results.

The above-described computer device functions as the control unit 11 when the CPU 11a executes a program stored in the ROM 11b with the RAM 11c as a work area. As illustrated in FIG. 3, the control unit 11 includes a call connection control unit 14, a signal transmission and reception control unit 15, and a DUT posture control unit 17. The call connection control unit 14, the signal transmission and reception control unit 15, and the DUT posture control unit 17 are also realized by the CPU 11a executing a predetermined program stored in the ROM 11b in the work area of the RAM 11c.

The call connection control unit 14 drives the test antenna 6 to transmit and receive a control signal (radio signal) to and from the DUT 100, and thus perform control of establishing a call (in a state where transmission and reception of a radio signal is possible) between the NR system simulator 20 and the DUT 100.

The signal transmission and reception control unit 15 monitors a user operation in the operation unit 12. When the user performs a predetermined measurement start operation related to the measurement of the transmission characteristics and the reception characteristics of the DUT 100, the signal transmission and reception control unit transmits a signal transmission command to the NR system simulator 20 through the call connection control in the call connection control unit 14. Further, the signal transmission and reception control unit 15 controls the NR system simulator 20 to transmit a test signal via the test antenna 6, and also controls the NR system simulator 20 to transmit a signal reception command and to receive a measurement target signal via the test antenna 6.

In the test of transmission and reception characteristics such as the RRM characteristics, which is performed using the two test antennae, the signal transmission and reception control unit 15 sets the arrival angle and selects the test antenna to be used. Specifically, the signal transmission and reception control unit selects one of a plurality of predetermined arrival angles (for example, 30°, 60°, 90°, 120°, 150°) and sets the selected arrival angle as a measurement condition (stored in the RAM 11c or the like). The arrival angle may be selected by a user, or may be automatically selected by the control unit 11 or the like. The signal transmission and reception control unit 15 selects the test antenna to be used from the plurality of test antennae 6 based on the set arrival angle. For example, when the set arrival angle is 30°, the signal transmission and reception control unit 15 selects the reflector reflection type test antenna 6a and the first mirror reflection type test antenna 6b, as the test antennae to be used. Therefore, for example, an arrival angle-test antenna correspondence table 17b showing a correspondence relation between the arrival angle and the test antenna is stored in advance in the ROM 11b. The control unit 11 or the control unit 22 of the NR system simulator 20 may set the arrival angle or select the test antenna to be used.

The DUT posture control unit 17 controls the posture of the DUT 100 held by the posture changeable mechanism 56, during the measurement. In order to realize such control, for example, a DUT posture control table 17a is stored in advance in the ROM 11b. The DUT posture control table 17a stores the number of drive pulses (number of operation pulses) for determining the rotational drive of a stepping motor, as control data, when the stepping motor is adopted as the drive unit 56a.

The DUT posture control unit 17 deploys the DUT posture control table 17a in the work area of the RAM 11c, and controls driving of the posture changeable mechanism 56 based on the DUT posture control table 17a so that the antenna 110 is sequentially directed in all three-dimensional directions, and the posture of the DUT 100 changes, as described above.

NR System Simulator

Figure 4:
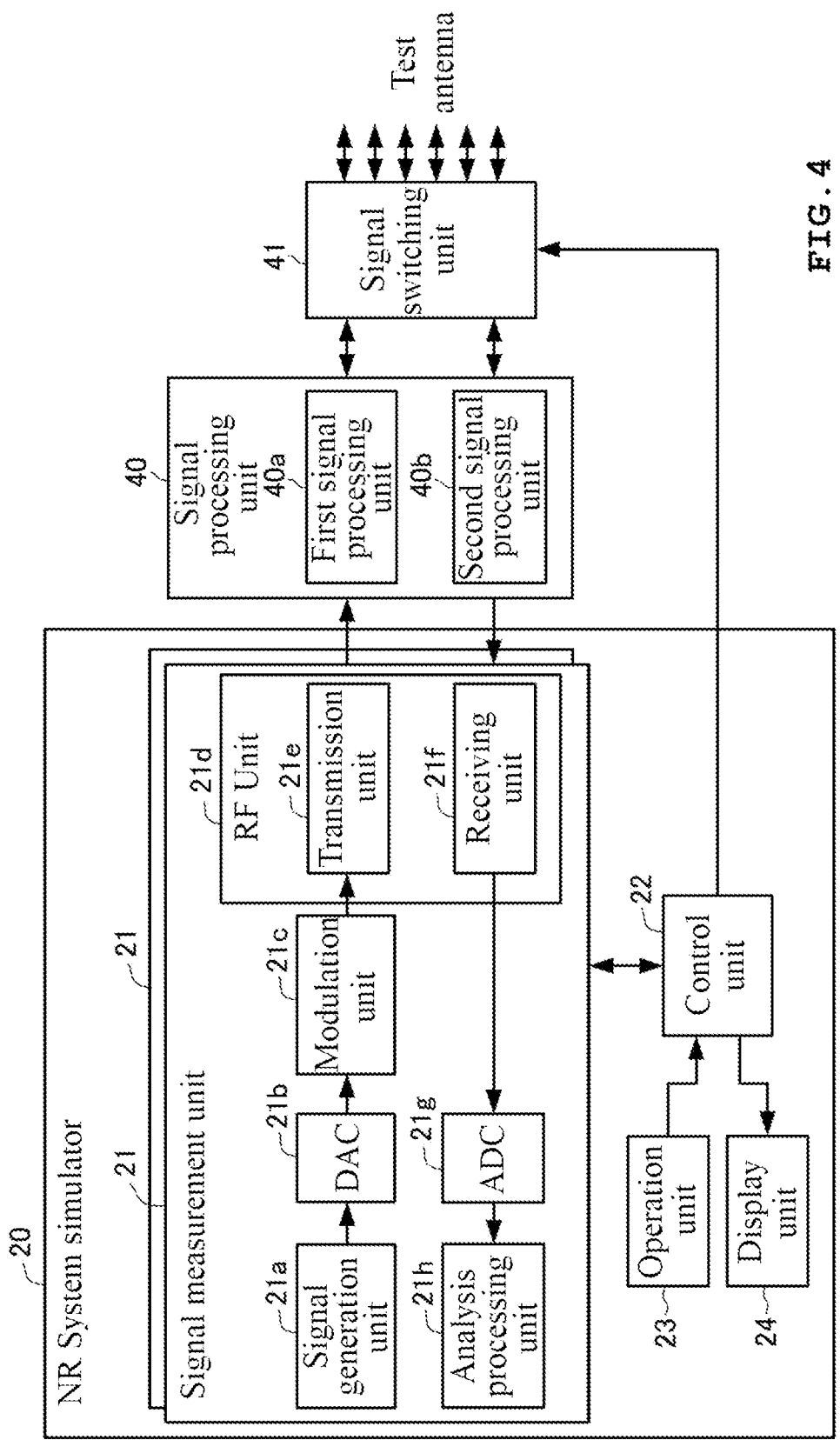
FIG. 4 is a block diagram illustrating a functional configuration of an NR system simulator in the test apparatus according to the first embodiment of the present invention.

As illustrated in FIG. 4, the NR system simulator 20 in the test apparatus 1 according to the present embodiment includes a signal measurement unit 21, a control unit 22, an operation unit 23, and a display unit 24. The signal measurement unit 21 includes a signal generation function unit and a signal analysis functional unit. The signal generation function unit includes a signal generation unit 21a, a digital-to-analog converter (DAC) 21b, a modulation unit 21c, a transmission unit 21e of an RF unit 21d. The signal analysis functional unit includes a receiving unit 21f of the RF unit 21d, an analog-to-digital converter (ADC) 21g, and an analysis processing unit 21h. Two sets of signal measurement units 21 may be provided to be able to correspond to two test antennae to be used.

In the signal generation function unit of the signal measurement unit 21, the signal generation unit 21a generates waveform data having a reference waveform, specifically, for example, an I component baseband signal and a Q component baseband signal being an orthogonal component signal of the I component baseband signal. The DAC 21b converts waveform data (I component baseband signal and Q component baseband signal) having a reference waveform output from the signal generation unit 21a, from a digital signal into an analog signal. The DAC outputs the resultant of the conversion to the modulation unit 21c. The modulation unit 21c performs modulation processing of mixing a local signal with each of the I component baseband signal and the Q component baseband signal, combining both signals, and outputting a digital modulation signal. The RF unit 21d generates a test signal corresponding to the frequency of each communication standard, from the digital modulation signal output from the modulation unit 21c. The RF unit outputs the generated test signal to the signal processing unit 40 by the transmission unit 21e.

The signal processing unit 40 includes a first signal processing unit 40a and a second signal processing unit 40b. The first signal processing unit 40a performs signal processing such as frequency conversion on a signal transmitted and received to and from one test antenna to be used. The second signal processing unit 40b performs signal processing such as frequency conversion on a signal transmitted and received to and from the other test antenna to be used. The first signal processing unit 40a performs signal processing on a test signal transmitted to the one test antenna to be used and outputs the test signal to the signal switching unit 41. The second signal processing unit 40b performs signal processing on a test signal transmitted to the other test antenna to be used and outputs the test signal to the signal switching unit 41. The signal switching unit 41 switches a signal path under the control of the control unit 22 so that the first signal processing unit 40a is connected to the one test antenna to be used, or the second signal processing unit 40b is connected to the other test antenna to be used. Thus, the test signal output from the first signal processing unit 40a is transmitted to the one test antenna to be used, via the signal switching unit 41, and is output from the test antenna to the DUT 100. The test signal output from the second signal processing unit 40b is transmitted to the other test antenna to be used, via the signal switching unit 41, and is output from the test antenna to the DUT 100.

In the signal analysis functional unit of the signal measurement unit 21, the receiving unit 21f receives the measurement target signal transmitted from the DUT 100 that has received the test signal with the antenna 110, through the signal switching unit 41 and the signal processing unit 40. Then, the RF unit 21d converts the measurement target signal into a signal (IF signal) in an intermediate frequency band by mixing the measurement target signal with the local signal. The ADC 21g converts the measurement target signal converted into the IF signal by the receiving unit 21f of the RF unit 21d, from the analog signal into a digital signal. Then, the ADC outputs the digital signal into the analysis processing unit 21h.

The analysis processing unit 21h generates waveform data corresponding to each of the I component baseband signal and the Q component baseband signal by performing digital processing on the measurement target signal being the digital signal output by the ADC 21g. Then, the analysis processing unit performs processing of analyzing the I component baseband signal and the Q component baseband signal based on the waveform data. In the measurement of the transmission characteristics (RF characteristics) of the DUT 100, the analysis processing unit 21h can measure, for example, equivalent isotropically radiated power (EIRP), total radiated power (TRP), spurious radiation, modulation accuracy (EVM), transmission power, constellation, spectrum, and the like. In the measurement of the reception characteristics (RF characteristics) of the DUT 100, the analysis processing unit 21h can measure, for example, reception sensitivity, a bit error rate (BER), a packet error rate (PER), and the like. Here, EIRP indicates the radio signal intensity in the main beam direction of the antenna 110 of the DUT 100. Further, TRP indicates the total value of the electric power radiated into the space from the antenna 110 of the DUT 100.

The analysis processing unit 21h is capable of analyzing the RRM characteristics of the DUT 100, for example, whether or not a handover operation from one selected test antenna to the other selected test antenna is normally performed.

The control unit 22 is configured by, for example, a computer device including a CPU, a RAM, a ROM, and various input/output interfaces, similar to the control unit 11 of the integrated control device 10 described above. The CPU performs predetermined information processing and control for realizing each function of the signal generation function unit, the signal analysis functional unit, the operation unit 23, and the display unit 24.

The operation unit 23 and the display unit 24 are connected to the input/output interface of the computer device. The operation unit 23 is a functional unit for inputting various types of information such as commands. The display unit 24 is a functional unit of displaying various types of information such as an input screen for the various types of information and measurement results.

In the present embodiment, the integrated control device 10 and the NR system simulator 20 are separate devices, but may be configured as one device. In this case, the control unit 11 of the integrated control device 10 and the control unit 22 of the NR system simulator 20 may be integrated and realized by one computer device.

Signal Processing Unit

Next, the signal processing unit 40 will be described.

The signal processing unit 40 includes a first signal processing unit 40a and a second signal processing unit 40b that are provided between the NR system simulator and the signal switching unit 41. The first signal processing unit performs signal processing such as frequency conversion on a signal transmitted and received to and from one test antenna to be used. The second signal processing unit performs signal processing such as frequency conversion on a signal transmitted and received to and from the other test antenna to be used.

The first signal processing unit 40a includes an up-converter, a down-converter, an amplifier, a frequency filter, and the like. The first signal processing unit performs signal processing such as frequency conversion (up-conversion), amplification, and frequency selection, on the test signal transmitted to the one test antenna to be used, and outputs the test signal to the signal switching unit 41. The first signal processing unit 40a performs signal processing such as frequency conversion (down-conversion), amplification, and frequency selection, on a measurement target signal input from the one test antenna to be used, via the signal switching unit 41. Then, the first signal processing unit outputs the measurement target signal to the signal measurement unit 21.

The second signal processing unit 40b includes an up-converter, a down-converter, an amplifier, a frequency filter, and the like. The second signal processing unit 40b performs signal processing such as frequency conversion (up-conversion), amplification, and frequency selection, on the test signal transmitted to the other test antenna to be used, and outputs the test signal to the signal switching unit 41. The second signal processing unit 40b performs signal processing such as frequency conversion (down-conversion), amplification, and frequency selection, on a measurement target signal input from the other test antenna to be used, via the signal switching unit 41. Then, the second signal processing unit outputs the measurement target signal to the signal measurement unit 21.

The signal switching unit 41 is provided between the signal processing unit 40 and the test antenna 6, and switches the signal path under the control of the control unit 22 so that the first signal processing unit 40a is connected to the one test antenna to be used, and/or the second signal processing unit 40b is connected to the other test antenna to be used. The signal switching unit 41 may be included in the signal processing unit 40.

Test Method

Figure 10:
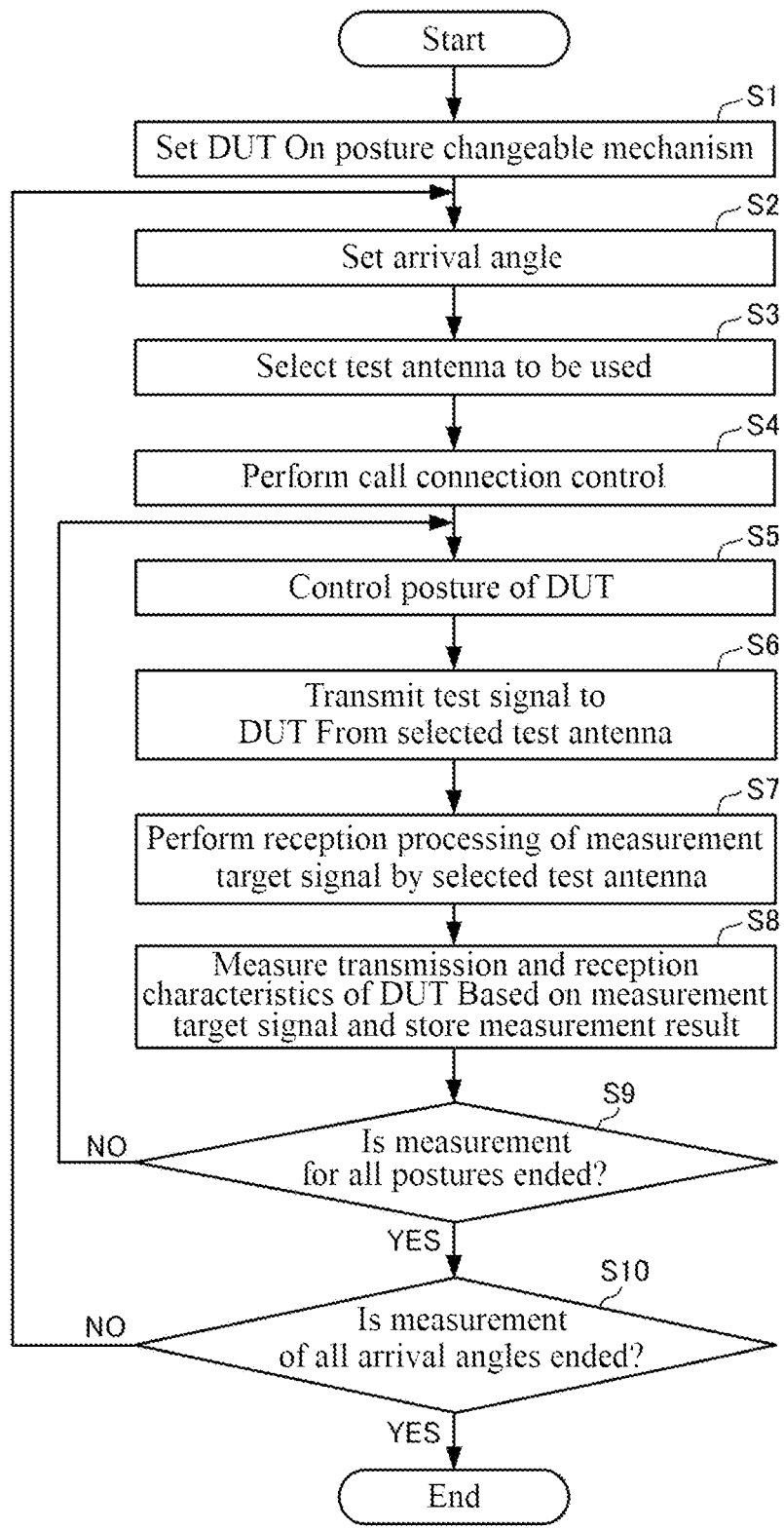
FIG. 10 is a flowchart illustrating an outline of a test method performed using the test apparatus according to the first embodiment of the present invention.

Next, a test method performed using the test apparatus 1 according to the present embodiment will be described with reference to the flowchart in FIG. 10. A test (for example, measurement of the transmission and reception characteristics such as the RRM characteristics) performed using two test antennae will be described below. However, this is just an example of the test method, and a specific test method varies depending on the type of test.

Firstly, the user sets a DUT 100 to be tested on the DUT mounting portion 56d of the posture changeable mechanism 56 provided in the internal space 51 of the OTA chamber 50 (Step S1).

Then, the user uses the operation unit 12 of the integrated control device 10 to perform a measurement start operation for instructing the control unit 11 to start measurement of the transmission characteristics and the reception characteristics of the DUT 100. The measurement start operation may be performed by the operation unit 23 of the NR system simulator 20.

The control unit 11 sets one of predetermined arrival angles (Step S2). For example, when the predetermined arrival angles include 30°, 60°, 90°, 120°, and 150°, the control unit 11 selects one (for example, 30°) of the arrival angles and sets (for example, stores in the RAM 11c) the selected arrival angle as an arrival angle to be measured. The arrival angle may be set by the user.

Then, the control unit 11 selects two test antennae for realizing the arrival angle based on the arrival angle set in Step S2. For example, when the set arrival angle is 30°, the control unit 11 selects the test antenna 6a and the test antenna 6b. When the set arrival angle is 60°, the control unit 11 selects the test antenna 6a and the test antenna 6c. When the set arrival angle is 90°, the control unit 11 selects the test antenna 6a and the test antenna 6d. When the set arrival angle is 120°, the control unit 11 selects the test antenna 6a and the test antenna 6e. When the set arrival angle is 150°, the control unit 11 selects the test antenna 6a and the test antenna 6f.

Then, the control unit 22 in the NR system simulator 20 performs a control of switching the signal path to the selected test antennae 6. Specifically, the control unit 22 in the NR system simulator acquires information on the two selected test antennae from the control unit 11 and transmits a switching signal to the signal switching unit 41. The signal switching unit 41 switches the signal path in accordance with the switching signal so that the selected test antenna 6 and the signal processing unit 40 are connected to each other.

The call connection control unit 14 of the control unit 11 performs call connection control by using the selected test antenna 6 to transmit and receive a control signal (radio signal) to and from the DUT 100 (Step S4). Specifically, the NR system simulator 20 transmits a control signal (call connection request signal) having a predetermined frequency to the DUT 100 via the test antenna 6 by radio. The DUT 100 that has received the call connection request signal transmits, as a response, a control signal (call connection response signal) after setting the frequency for which the connection is requested. The NR system simulator 20 receives the call connection response signal and confirms that the response has been received normally. A series of the processing refers to the call connection control. With the call connection control, a state in which a radio signal having a predetermined frequency can be transmitted and received between the NR system simulator 20 and the DUT 100 via the selected test antenna 6 is established.

Processing in which the DUT 100 receives the radio signal transmitted from the NR system simulator 20 via the test antenna 6 is referred as downlink (DL) processing. On the contrary, processing in which the DUT 100 transmits the radio signal to the NR system simulator 20 via the test antenna 6 is referred to as uplink (UL) processing. The test antenna 6 is used to perform the processing of establishing a link (call) and the processing of downlink (DL) and uplink (UL) after the link is established, and also functions as the link antenna.

After establishing the call connection in Step S4, the DUT posture control unit 17 of the integrated control device 10 controls the posture of the DUT 100 disposed in the quiet zone QZ to a predetermined posture by the posture changeable mechanism 56 (Step S5).

After the posture of the DUT 100 is controlled to a predetermined posture by the posture changeable mechanism 56, the signal transmission and reception control unit 15 of the integrated control device 10 transmits a signal transmission command to the NR system simulator 20. The NR system simulator 20 transmits a test signal to the DUT 100 via the selected test antenna 6 based on the signal transmission command (Step S6).

The transmission control of the test signal by the NR system simulator 20 is performed as follows. In the NR system simulator 20 (see FIG. 4), the signal generation unit 21a generates a signal for generating a test signal under the control of the control unit 22 that has received the signal transmission command. Then, the DAC 21b performs digital-to-analog conversion processing on the signal generated by the signal generation unit. The modulation unit 21c performs modulation processing on the analog signal obtained by the digital-to-analog conversion. The RF unit 21d generates the test signal corresponding to the frequency of each communication standard, from the modulated signal. The transmission unit 21e transmits the test signal (DL data) to the signal processing unit 40.

The signal processing unit 40 is provided in the OTA chamber 50, performs signal processing such as frequency conversion (up-conversion), amplification, and frequency selection, and outputs the signal to the switching unit 140. The switching unit 140 transmits the signal processed by the signal processing unit 40 to the selected test antenna 6, and the test antenna 6 outputs the signal to the DUT 100. The signal processing unit 40 can also perform processing on a plurality of signals in order to perform signal processing for two test antennae in response to the selection of the test antenna 6 by the control unit 11. In this case, a switching mechanism that switches a connection between the test antennae 6a, 6b, 6c, 6d, 6e, and 6f and the two signal processing units 40, and signal processing on a plurality of test signals is performed.

The signal transmission and reception control unit 15 performs control during a period after the control of test signal transmission is started in Step S6 until the measurement of the transmission characteristics and the reception characteristics of the DUT 100 is ended, so that the test signal is transmitted at an appropriate timing.

The DUT 100 receives the test signal (DL data) transmitted via the test antenna 6 by the antenna 110 in a state of different postures that are sequentially changed based on the posture control in Step S5. In addition, the DUT transmits the measurement target signal being a response signal to the test signal.

After the transmission of the test signal is started in Step S6, reception processing is subsequently performed under the control of the signal transmission and reception control unit 15 (Step S7). In the reception processing, the test antenna 6 receives the measurement target signal transmitted from the DUT 100 that has received the test signal and outputs the received signal to the signal switching unit 41. The signal switching unit 41 performs switching of, for example, the signal path and outputs the measurement target signal to the signal processing unit 40. The signal processing unit 40 performs signal processing such as frequency conversion (down-conversion), amplification, and frequency selection, and outputs the measurement target signal to the NR system simulator 20.

The NR system simulator 20 performs measurement processing of measuring the measurement target signal subjected to frequency conversion by the signal processing unit 40 (Step S8).

Specifically, the receiving unit 21f of the RF unit 21d in the NR system simulator 20 receives an input of the measurement target signal subjected to signal processing by the signal processing unit 40. Under the control of the control unit 22, the RF unit 21d converts the measurement target signal input to the receiving unit 21f into an IF signal having a lower frequency. Then, the ADC 21g converts the IF signal from an analog signal to a digital signal and outputs the digital signal to the analysis processing unit 21h, under the control of the control unit 22. The analysis processing unit 21h generates waveform data corresponding to each of the I component baseband signal and the Q component baseband signal. Further, the analysis processing unit 21h analyzes the measurement target signal based on the generated waveform data under the control of the control unit 22. The signal processing unit 40 can also perform processing on a plurality of signals in order to perform signal processing for two test antennae in response to the selection of the test antenna 6 by the control unit 11. In this case, the switching mechanism that switches a connection between the test antennae 6a, 6b, 6c, 6d, 6e, and 6f and the signal processing unit 40, and processing on a plurality of test signals is performed.

More specifically, in the NR system simulator 20, the analysis processing unit 21h measures the transmission characteristics and the reception characteristics of the DUT 100 based on the analysis result of the measurement target signal under the control of the control unit 22.

For example, for the transmission characteristics (RF characteristics) of the DUT 100, processing as follows is performed. Firstly, the NR system simulator 20 transmits a request frame for transmitting an uplink signal as a test signal under the control of the control unit 22. The DUT 100 transmits the uplink signal frame as the measurement target signal to the NR system simulator 20 in response to the request frame for transmitting the uplink signal. The analysis processing unit 21h performs processing of evaluating the transmission characteristics of the DUT 100 based on the uplink signal frame.

For the reception characteristics (RF characteristics) of the DUT 100, processing as follows is performed, for example. Under the control of the control unit 22, the analysis processing unit 21h calculates the number of transmissions of the measurement frame transmitted from the NR system simulator 20 as the test signal, and a ratio of the number of receptions of ACK and NACK transmitted from the DUT 100 as the measurement target signal with respect to the measurement frame, as an error rate (PER).

Regarding the RRM characteristics of the DUT 100, for example, the analysis processing unit 21h may perform a test of whether or not the handover operation from one selected test antenna to the other selected test antenna is normally performed. The analysis processing unit may perform such a test under the control of the control unit 22 while changing the posture of the DUT 100.

In Step S8, the analysis processing unit 21h stores the measurement results of the transmission characteristics and the reception characteristics of the DUT 100 in a storage area such as the RAM (not illustrated), under the control of the control unit 22. The measurement results may be displayed on the display unit 24 or the display unit 13.

Then, the control unit 11 of the integrated control device 10 determines whether or not the measurement of the transmission characteristics and the reception characteristics of the DUT 100 has been ended for all desired postures (Step S9). Here, when it is determined that the measurement has not been ended (NO in Step S9), the process returns to Step S5 and continues the processing.

When the control unit 11 determines that the measurement is ended for all postures (YES in Step S9), the control unit 11 determines whether or not the measurement is ended for all arrival angles (Step S10).

When the control unit 11 determines that the measurement is not ended for all the arrival angles (NO in Step S10), the control unit 11 causes the process to return to Step S2 and continues the processing. When the control unit 11 determines that the measurement is ended for all the arrival angles (YES in Step S10), the control unit 11 ends the test.

As described above, the test apparatus 1 according to the present embodiment includes the reflector reflection type test antenna 6a that transmits or receives the radio signal to or from the antenna 110 of the DUT 100 via the reflector 7, and the mirror reflection type test antennae 6b, 6c, 6d, 6e, and 6f that transmit or receive the radio signal to or from the antenna 110 via the mirror 9. Since it is possible to change the propagation direction of a radio wave by the mirror 9, it is possible to lengthen the propagation distance of the radio wave in a limited small space in the OTA chamber 50. Thus, it is possible to secure the distance between the test antenna 6 and the antenna 110 of the DUT 100, which is required for the far field measurement. With this configuration, it is possible to reduce the size of the OTA chamber 50 and reduce the cost of the test apparatus 1, in comparison to a case using the DFF type antenna in the related art.

In addition, the test antenna 6 has a hybrid configuration of including the reflector reflection type test antenna 6a that indirectly transmits and receives the radio signal using the reflector 7 and the mirror reflection type test antennae 6b, 6c, 6d, 6e, and 6f that transmit and receive the radio signal via the mirror 9. Thus, it is possible to reduce the number of reflector reflection type test antennae having a complex structure, to the minimum. When the reflector reflection type test antenna 6a that may form the quiet zone relatively wider than the mirror reflection type test antenna is singly used, it is possible to use the wide quiet zone. Therefore, in the test apparatus 1 according to the present embodiment, it is possible to perform the far field measurement of the transmission and reception characteristics of the DUT 100, such as the RF characteristics and the RRM characteristics, with high accuracy and low cost.

Second Embodiment

Next, a test apparatus according to a second embodiment of the present invention will be described.

The test apparatus according to the second embodiment is different from the test apparatus in the first embodiment in that one mirror reflection type test antenna 6g and a direction change mechanism 60 are used in the second embodiment, but the five mirror reflection type test antennae 6b, 6c, 6d, 6e, and 6f are used in the first embodiment. Other components are the same, the same components are denoted by the same reference signs, and detailed description thereof will be omitted as appropriate.

Figure 11:
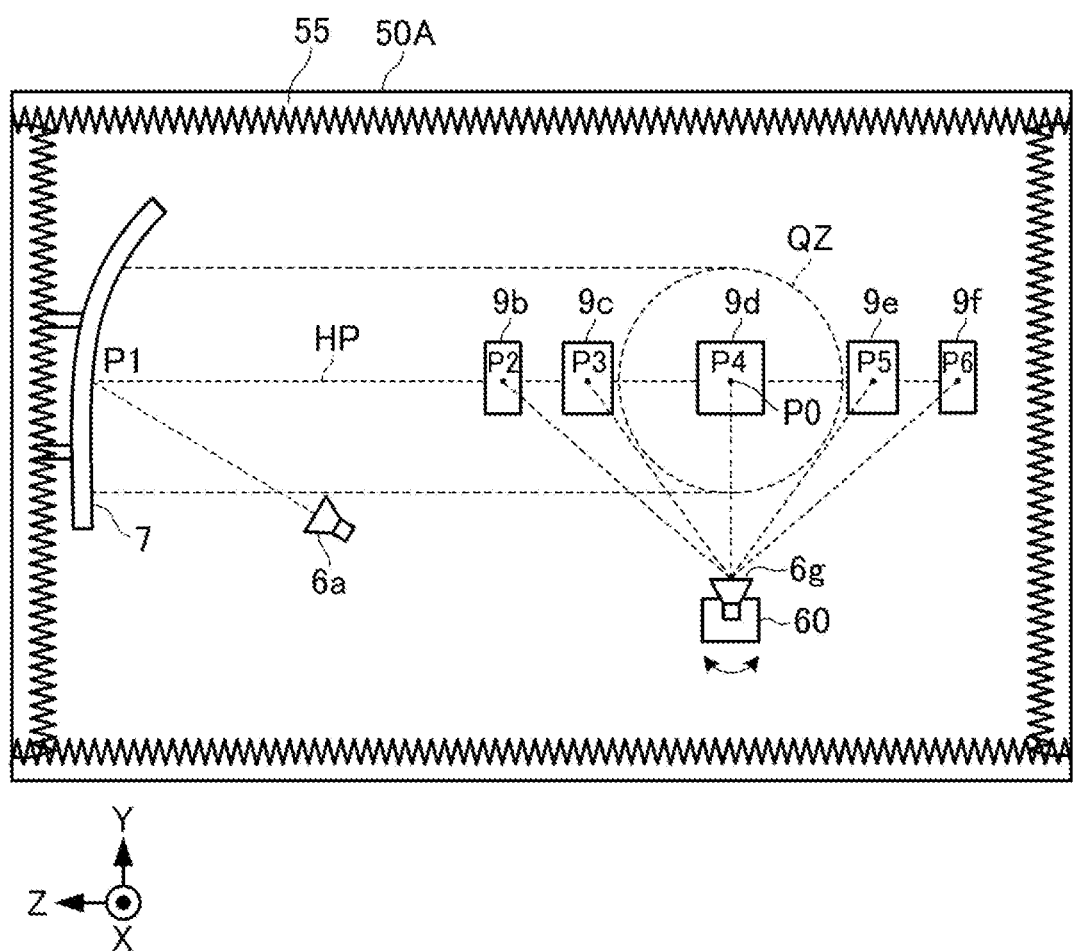
FIG. 11 is a front view when an OTA chamber is viewed from the front side with removing a side plate of the OTA chamber on the front side in a test apparatus according to a second embodiment of the present invention.
Figure 12:
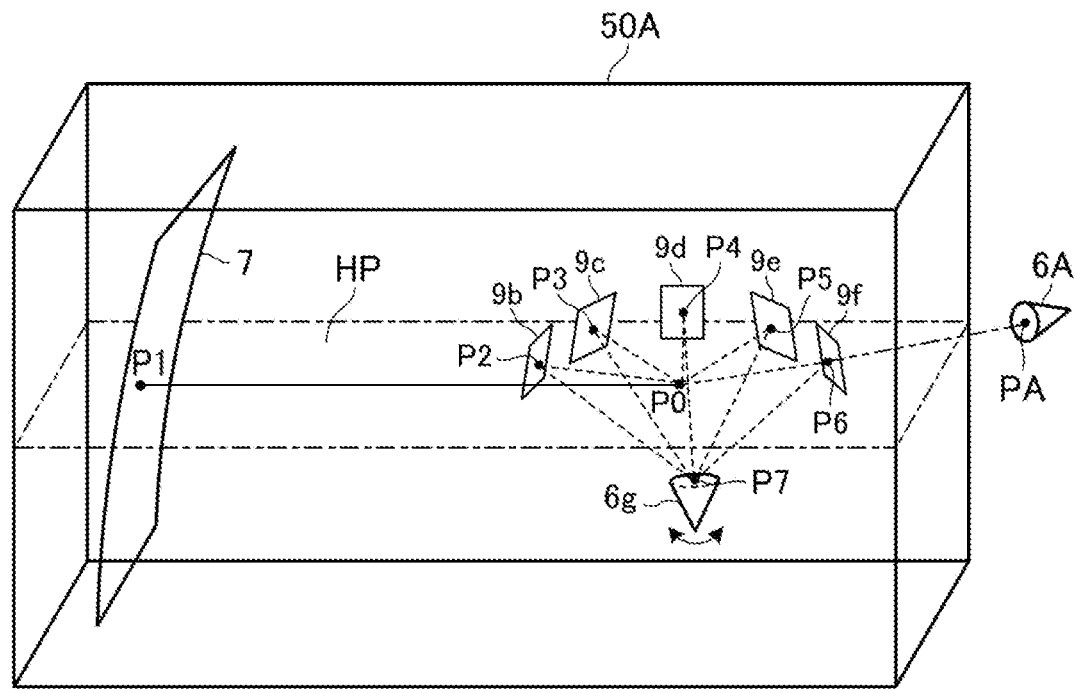
FIG. 12 is a schematic diagram illustrating arrangement of a mirror and a mirror reflection type test antenna in the OTA chamber according to the second embodiment.

FIG. 11 is a front view when an OTA chamber 50A is viewed from the front side with removing a side plate of the OTA chamber on the front side. FIG. 12 is a schematic diagram illustrating the arrangement of mirrors 9b, 9c, 9d, 9e, and 9f and the mirror reflection type test antenna 6g in the OTA chamber 50A. As illustrated in FIGS. 11 and 12, in the OTA chamber 50A according to the present embodiment, a first mirror 9b, a second mirror 9c, a third mirror 9d, a fourth mirror 9e, and a fifth mirror 9f are installed. The test antenna 6g that transmits and receives a radio signal via one selected from a plurality of mirrors 9b, 9c, 9d, 9e, and 9f is installed in the OTA chamber 50A. The test antenna 6g includes a horizontally polarized antenna and a vertically polarized antenna.

The mirrors 9b, 9c, 9d, 9e, and 9f are arranged so that the mirror surface of each mirror intersects with a horizontal plane HP passing through an arrangement position P0 of a DUT 100, as in the first embodiment. The difference from the first embodiment is that each mirror 9 is disposed at a posture that causes a radio beam radiated from the one mirror reflection type test antenna 6g to be reflected toward the DUT 100.

The test apparatus according to the present embodiment further includes the direction change mechanism 60 that changes a radio-wave transmission direction of the mirror reflection type test antenna 6g to be direct toward one of a plurality of mirrors 9b, 9c, 9d, 9e, and 9f. The direction change mechanism 60 in the present embodiment corresponds to a direction change unit in the present invention.

Figure 13:
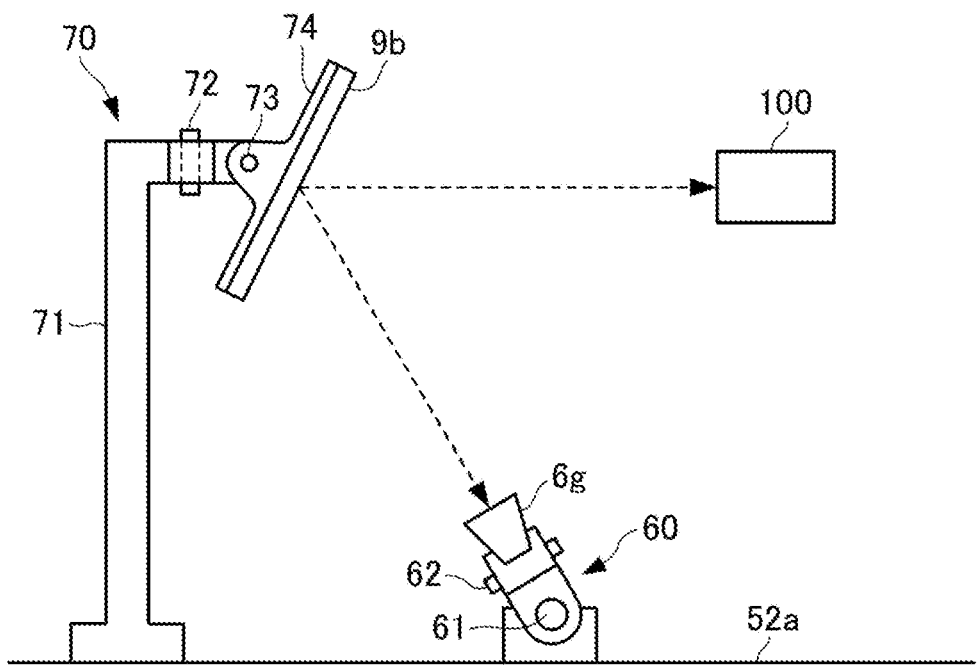
FIG. 13 is a schematic diagram illustrating the mirror and the mirror reflection type test antenna according to the second embodiment.

As illustrated in FIG. 13, the test antenna 6g is disposed below the horizontal plane HP passing through the arrangement position P0 of the DUT 100. The mirrors 9b, 9c, 9d, 9e, and 9f are arranged so that reflection points P2, P3, P4, P5, and P6 of a radio beam on the mirror surface are located on the horizontal plane HP. The test antenna 6g can be set to be directed toward any one of the mirrors 9b, 9c, 9d, 9e, and 9f by the direction change mechanism 60.

For example, when the test antenna 6g is directed in the direction of the mirror 9f, a radio beam radiated from the test antenna 6g is reflected by the mirror 9f and transmitted to the arrangement position P0 of the DUT 100. A radio beam radiated from the antenna 110 of the DUT 100 is reflected by the mirror 9f and transmitted to the test antenna 6g. At this time, if the mirror 9f is not provided, the test antenna 6A is disposed outside the OTA chamber 50A, and thus it is not possible to secure the inter-antenna distance (P0-PA distance) required for the far field measurement. Since the propagation path of the radio beam is bent by the mirror 9f, it is possible to dispose the test antenna 6f in the OTA chamber 50A, and secure the inter-antenna distance required for the far field measurement.

Specifically, in FIG. 12, a distance obtained by combining a P0-P6 distance and a P6-P7 distance is equal to the P0-PA distance being the inter-antenna distance required for the far field measurement. P7 indicates the aperture center of the test antenna 6g. The propagation path between P0 and P6 is on the horizontal plane HP.

The same is applied when the test antenna 6g is directed toward the mirror other than the mirror 9f. For example, when the test antenna 6g is directed toward the mirror 9b, the radio beam radiated from the test antenna 6g is reflected by the mirror 9b and transmitted to the arrangement position P0 of the DUT 100. The radio beam radiated from the antenna 110 of the DUT 100 is reflected by the mirror 9b and transmitted to the test antenna 6g. The distance obtained by combining the P0-P2 distance and the P2-P7 distance is set to be equal to or more than the shortest inter-antenna distance required for the far field measurement.

FIG. 13 is a schematic diagram illustrating the mirror 9b and the mirror reflection type test antenna 6g according to the second embodiment. As illustrated in FIG. 13, the test antenna 6g is attached to the direction change mechanism 60 installed on the bottom surface 52a of the OTA chamber 50A. The direction change mechanism 60 can rotate the test antenna 6g around a rotation shaft portion 61 parallel to the bottom surface 52a and around a rotation shaft portion 62 perpendicular to the rotation shaft portion 61. Thus, the test antenna 6g can freely change the radiation direction of a radio beam to the direction of one selected from the mirrors 9b, 9c, 9d, 9e, and 9f. The direction change mechanism 60 is a biaxial positioner, but may be a uniaxial positioner depending on the arrangement of the mirror 9.

As illustrated in FIG. 13, the mirror 9b is attached to a mirror holder 70 installed on the bottom surface 52a of the OTA chamber 50A. The mirror holder 70 includes a fulcrum 71 and an attachment portion 74 for attaching the mirror 9b. The attachment portion 74 can rotate around a rotation shaft portion 72 perpendicular to the bottom surface 52a, and can rotate around a rotation shaft portion 73 perpendicular to the rotation shaft portion 72. Thus, the posture of the mirror 9b attached to the attachment portion 74 can be freely adjusted, and the posture of the mirror 9b is adjusted so that the radio beam radiated from the test antenna 6g is reflected by the mirror 9b and directed toward the DUT 100.

In the present embodiment, the one mirror reflection type antenna 6g and the five mirrors 9b, 9c, 9d, 9e, 9f are used, but the number of antennae is not limited to this. Any number may be set depending on the test content.

Third Embodiment

Next, a test apparatus according to a third embodiment of the present invention will be described.

The test apparatus according to the third embodiment is different from the test apparatus in the first embodiment in that one mirror 9d is used in the third embodiment, but the five mirrors 9b, 9c, 9d, 9e, and 9f are used in the first embodiment. The same components are denoted by the same reference signs, and detailed description thereof will be omitted as appropriate.

Figure 14:
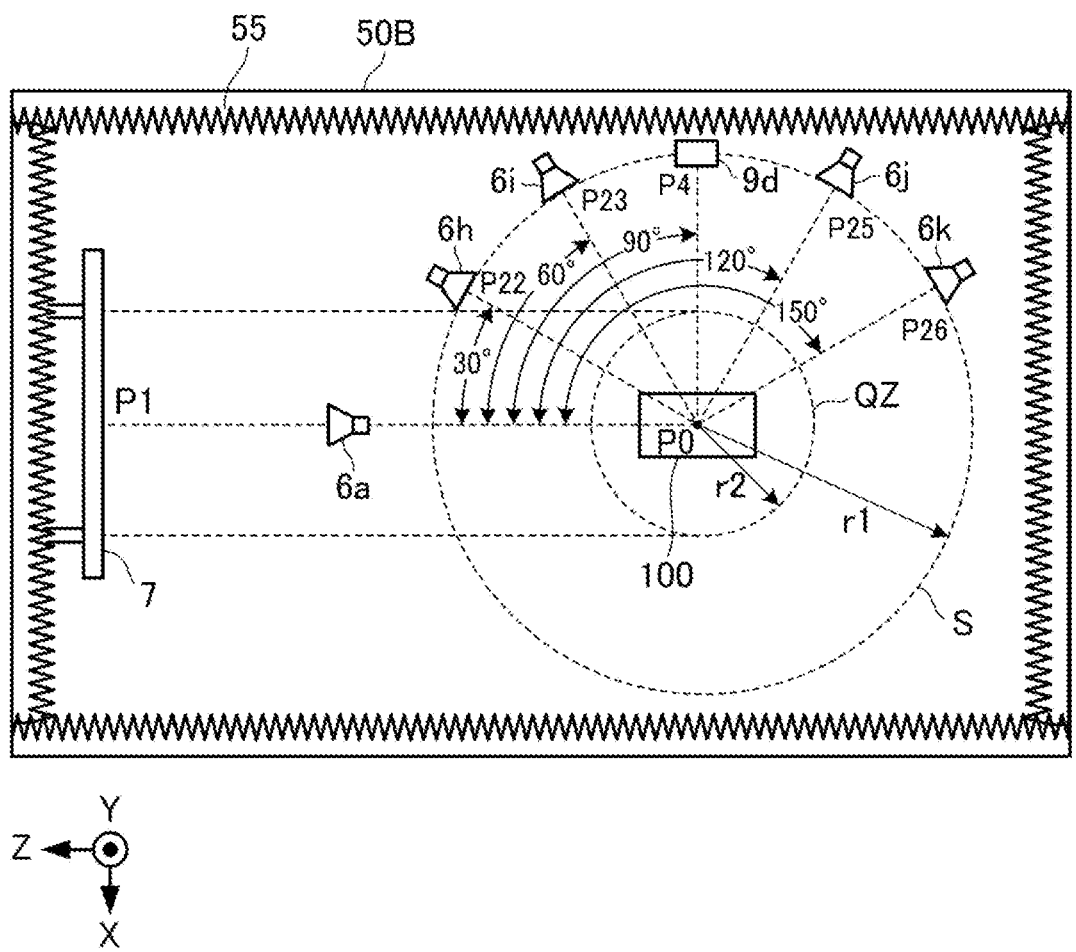
FIG. 14 is a plan view when an OTA chamber in a test apparatus according to a third embodiment of the present invention is viewed from above with removing a top plate of the OTA chamber.
Figure 15:
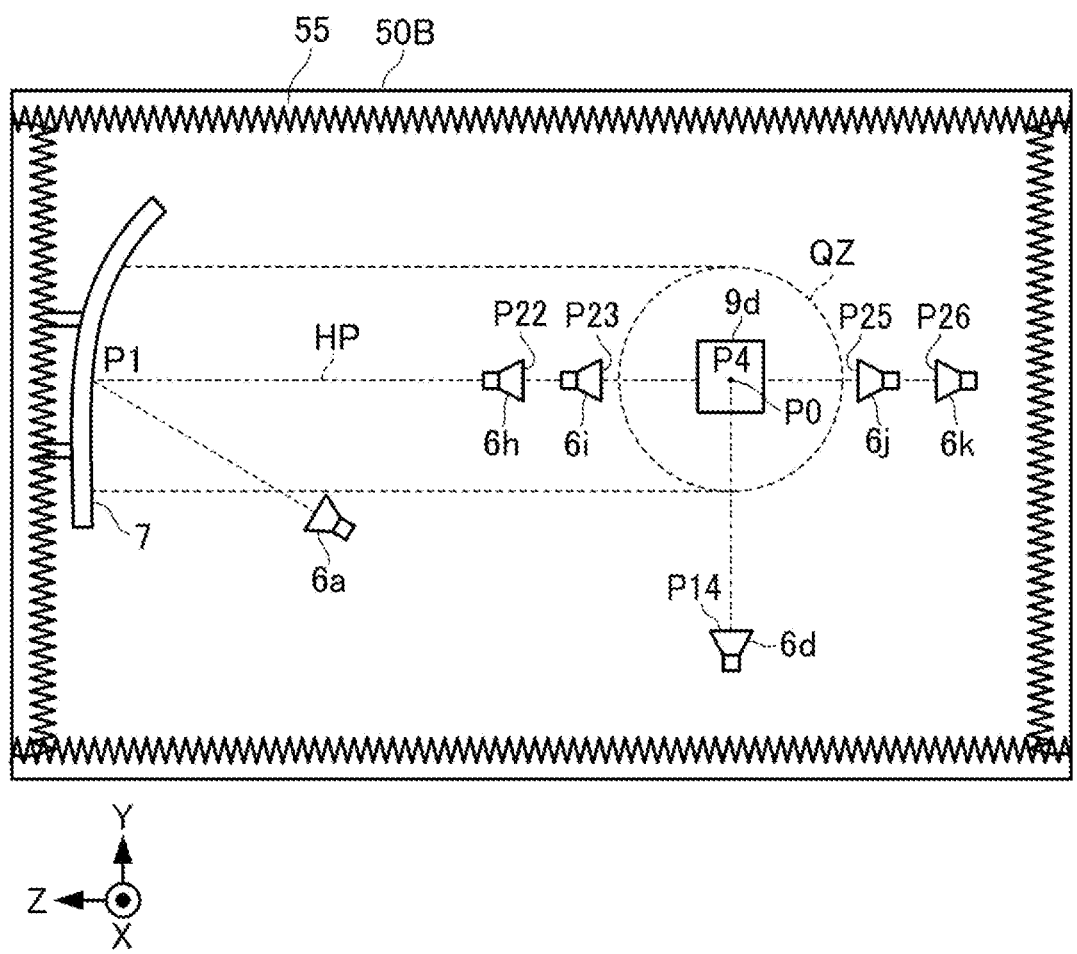
FIG. 15 is a front view of the test apparatus according to the third embodiment of the present invention as viewed from the front side with the side plate on the front side of the OTA chamber removed.

FIG. 14 is a plan view when an OTA chamber 50B according to the present embodiment is viewed from above with removing a top plate of the OTA chamber 50B. FIG. 15 is a front view when the OTA chamber 50B is viewed from the front side with removing a side plate of the OTA chamber 50B on the front side. As illustrated in FIGS. 14 and 15, a reflector reflection type test antenna 6a, a reflector 7 corresponding to the test antenna 6a, a mirror reflection type test antenna 6d, and a mirror 9d corresponding to the test antenna 6d are provided in the OTA chamber 50B. In the present embodiment, direct type test antennae 6h, 6i, 6j, and 6k that directly transmit or receive a radio signal to or from an antenna 110 of a DUT 100 are further provided in the OTA chamber 50B. Each test antenna 6 includes a horizontally polarized antenna and a vertically polarized antenna.

The mirror 9d is disposed so that a reflection point P4 of a radio beam on the mirror surface is on a horizontal plane HP passing through an arrangement position P0 of the DUT 100. The mirror reflection type test antenna 6d is disposed below the horizontal plane HP passing through the arrangement position P0 of the DUT 100.

A radio beam radiated from the mirror reflection type test antenna 6d is reflected by the mirror 9d and transmitted to the arrangement position P0 of the DUT 100. The radio beam radiated from the antenna 110 of the DUT 100 is reflected by the mirror 9d and transmitted to the test antenna 6d. The distance obtained by combining the P0-P4 distance and the P4-P14 distance is set to be equal to or more than the shortest inter-antenna distance required for the far field measurement.

In the present embodiment, the direct type test antennae 6h, 6i, 6j, and 6k are arranged on a virtual spherical surface S and the horizontal plane HP. The virtual spherical surface has a radius r1 with the arrangement position P0 of the DUT 100 as the center. Specifically, reflection points P22, P23, P25, and P26 of a radio beam on the reflecting surfaces of the direct type test antennae 6h, 6i, 6j, and 6k are on the horizontal plane HP. It is not necessary that the direct type test antennae 6h, 6i, 6j, and 6k are arranged at the same distance from the DUT 100. The direct type test antennae 6h, 6i, 6j, and 6k may have different distances from the DUT 100.

As described above, the test apparatus according to the present embodiment is suitable for a form in which the direct type test antennae 6h, 6i, 6j, and 6k are used when it is possible to secure the inter-antenna distance required for the far field measurement by a linear distance, and the mirror reflection type test antenna 6d is used only when it is not possible to secure the inter-antenna distance required for the far field measurement by a linear distance. Thus, it is possible to reduce the number of mirrors to the required minimum.

In the present embodiment, the four direct type test antennae 6h, 6i, 6j, and 6k and the one mirror reflection type test antenna 6d are used, but the number of antennae is not limited to this. Any number may be set depending on the test content.

The present invention can be applied not only to an anechoic box but also to an anechoic chamber.

As described above, the present invention has an effect that it is possible to perform the far field measurement of the transmission and reception characteristics of a device under test, such as the RF characteristics and the RRM characteristics, with high accuracy and low cost, and is useful in general for the test apparatus and the test method of a radio terminal.

DESCRIPTION OF REFERENCE NUMERALS AND SIGNS

1 Test apparatus
2 Measurement device
5, 8 Link antenna
6 Test antenna
6a Reflector reflection type test antenna
6b, 6c, 6d, 6e, 6f Mirror reflection type test antenna (first to fifth test antennae)
6g Mirror reflection type test antenna
6h, 6i, 6j, 6k Direct type test antenna
7 Reflector
7A Reflecting mirror
9b, 9c, 9d, 9e, 9f Mirror (first to fifth mirrors)
10 Integrated control device
11, 22 Control unit
11a CPU
11b ROM
11c RAM
11d External interface unit
12, 23 Operation unit
13, 24 Display unit
14 Call connection control unit
15 Signal transmission and reception control unit
17 DUT posture control unit
17a DUT posture control table
17b arrival angle-test antenna correspondence table
19 Network
20 NR system simulator
21 Signal measurement unit
21a Signal generation unit
21b DAC
21c Modulation unit
21d RF unit
21e Transmission unit
21f Receiving unit
21g ADC
21h Analysis processing unit
40 Signal processing Unit
40a First signal processing unit
40b Second signal processing unit
41 Signal switching unit
50 OTA chamber (anechoic box)
51 Internal space
52 Housing body
52a Bottom surface
52b Side surface
52c Top surface
55 Radio wave absorber
56 Posture changeable mechanism
56a Drive unit
56b Turntable
56c Fulcrum 56d DUT mounting portion
57, 59 Holder
58 Reflector holder
60 Direction change mechanism (direction change unit)
61, 62, 72, 73 Rotation shaft portion
70 Mirror holder
71 Fulcrum
74 Attachment portion
90 Rack structure body
90a Each rack
100 DUT (device under test)
100A Radio terminal
110 Antenna (antenna under test)
F Focal position of reflector
QZ Quiet zone
S Virtual spherical surface
HP Horizontal plane

What is claimed is:

1. A test apparatus that measures transmission characteristics or reception characteristics of a device under test including an antenna under test, the apparatus comprising:
    an anechoic box that has an internal space that is not influenced by a surrounding radio wave environment;
    a test antenna that is provided in the internal space, and transmits or receives a radio signal to or from the antenna under test;
    a reflector that is provided in the internal space and reflects the radio signal;
    one or a plurality of mirrors that are provided in the internal space and reflect the radio signal; and
    a measurement device that measures the transmission characteristics or the reception characteristics of the device under test disposed in a quiet zone in the internal space, by using the test antenna,
    wherein the test antenna includes
        a reflector reflection type test antenna that transmits or receives the radio signal to or from the antenna under test via the reflector, and
        mirror reflection type test antennae that transmit or receive the radio signal to or from the antenna under test via at least one of the one or the plurality of mirrors.

2. The test apparatus according to claim 1,
wherein the plurality of the mirrors are provided, and
the plurality of mirrors that reflect the radio signal from the mirror reflection type test antenna are arranged to form different arrival angles with respect to a radio-wave arrival direction from the reflector reflection type test antenna at an arrangement position of the device under test.

3. The test apparatus according to claim 2,
wherein the plurality of the mirrors are provided, and
the plurality of mirrors are arranged so that each mirror surface of the plurality of mirrors intersects with a plane passing through the arrangement position of the device under test.

4. The test apparatus according to claim 3,
wherein the reflector has a reflecting surface bent in a curved surface, and
the mirror has a flat mirror surface.

5. The test apparatus according to claim 2,
wherein the one or the plurality of mirrors includes a first mirror, a second mirror, a third mirror, a fourth mirror, and a fifth mirror,
the mirror reflection type test antenna includes
    a first test antenna that transmits and receives the radio signal via the first mirror,
    a second test antenna that transmits and receives the radio signal via the second mirror,
    a third test antenna that transmits and receives the radio signal via the third mirror,
    a fourth test antenna that transmits and receives the radio signal via the fourth mirror, and
    a fifth test antenna that transmits and receives the radio signal via the fifth mirror.

6. The test apparatus according to claim 2,
wherein the reflector has a reflecting surface bent in a curved surface, and
the mirror has a flat mirror surface.

7. The test apparatus according to claim 1,
wherein the plurality of the mirrors are provided, and
the plurality of mirrors are arranged so that each mirror surface of the plurality of mirrors intersects with a plane passing through an arrangement position of the device under test.

8. The test apparatus according to claim 1,
wherein the one or the plurality of mirrors include a first mirror, a second mirror, a third mirror, a fourth mirror, and a fifth mirror,
the mirror reflection type test antenna includes
    a first test antenna that transmits and receives the radio signal via the first mirror,
    a second test antenna that transmits and receives the radio signal via the second mirror,
    a third test antenna that transmits and receives the radio signal via the third mirror,
    a fourth test antenna that transmits and receives the radio signal via the fourth mirror, and
    a fifth test antenna that transmits and receives the radio signal via the fifth mirror.

9. The test apparatus according to claim 1,
wherein the plurality of the mirrors are provided, and
the test apparatus further comprises a direction change unit that changes a radio-wave transmission direction of the mirror reflection type test antenna to be directed to one of the plurality of mirrors.

10. The test apparatus according to claim 7,
wherein the one or the plurality of mirrors include a first mirror, a second mirror, a third mirror, a fourth mirror, and a fifth mirror, and
the mirror reflection type test antenna includes a test antenna that transmits and receives the radio signal via one selected from the plurality of mirrors by the direction change unit.

11. The test apparatus according to claim 10,
wherein the reflector has a reflecting surface bent in a curved surface, and
the mirror has a flat mirror surface.

12. The test apparatus according to claim 9,
wherein the reflector has a reflecting surface bent in a curved surface, and
the mirror has a flat mirror surface.

13. The test apparatus according to claim 1,
wherein a distance from the mirror reflection type test antenna to the antenna under test via the corresponding mirror is more than $2D^2/\lambda$, where D indicates an antenna size of the antenna under test, and $\lambda$ indicates a wavelength of a radio wave transmitted from the mirror reflection type test antenna.

14. The test apparatus according to claim 13,
wherein the reflector has a reflecting surface bent in a curved surface, and
the mirror has a flat mirror surface.

15. The test apparatus according to claim 14,
wherein the reflector reflection type test antenna
is disposed at a focal position of the reflector, and
converts a radio wave of a spherical wave emitted from the reflector reflection type test antenna to a radio wave of a plane wave and transmits the radio wave of the plane wave to the device under test, and
causes the radio wave of the plane wave, which is emitted from the device under test and then is incident to the reflector to focus on the test antenna.

16. The test apparatus according to claim 1, further comprising:
direct type test antennae that directly transmit or receive the radio signal to or from the antenna under test.

17. The test apparatus according to claim 10,
wherein the reflector has a reflecting surface bent in a curved surface, and
the mirror has a flat mirror surface.

18. The test apparatus according to claim 1,
wherein the reflector has a reflecting surface bent in a curved surface, and
the mirror has a flat mirror surface.

19. The test apparatus according to claim 1,
wherein the reflector reflection type test antenna
is disposed at a focal position of the reflector, and
converts a radio wave of a spherical wave emitted from the reflector reflection type test antenna to a radio wave of a plane wave and transmits the radio wave of the plane wave to the device under test, and
causes the radio wave of the plane wave, which is emitted from the device under test and then is incident to the reflector to focus on the test antenna.

20. A test method using a test apparatus that measures transmission characteristics or reception characteristics of a device under test including an antenna under test, the test apparatus including
an anechoic box that has an internal space that is not influenced by a surrounding radio wave environment,
a test antenna that is provided in the internal space, and transmits or receives a radio signal to or from the antenna under test,
a reflector that is provided in the internal space and reflects the radio signal,
one or a plurality of mirrors that are provided in the internal space and reflect the radio signal, and
a measurement device that measures the transmission characteristics or the reception characteristics of the device under test disposed in a quiet zone in the internal space, by using the test antenna,
in which the test antenna includes a reflector reflection type test antenna that transmits or receives the radio signal to or from the antenna under test via the reflector, and mirror reflection type test antennae that transmit or receive the radio signal to or from the antenna under test via at least one of the one or the plurality of mirrors,
the method comprising:
a step of selecting a test antenna to be used among the test antennae;
a step of sequentially changing a posture of the device under test disposed in the quiet zone; and
a step of measuring the transmission characteristics or the reception characteristics of the device under test by using the selected test antenna, each time the posture of the device under test is changed.

* * * * *